United States Patent
Liaw

(10) Patent No.: US 11,991,872 B2
(45) Date of Patent: May 21, 2024

(54) SEMICONDUCTOR DEVICE WITH GATE RECESS AND METHODS OF FORMING THE SAME

(71) Applicant: Taiwan Semiconductor Manufacturing Company, Ltd., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/833,396

(22) Filed: Jun. 6, 2022

(65) Prior Publication Data

US 2022/0302135 A1   Sep. 22, 2022

Related U.S. Application Data

(62) Division of application No. 17/027,449, filed on Sep. 21, 2020, now Pat. No. 11,355,502.

(51) Int. Cl.

| | | |
|---|---|---|
| H10B 10/00 | (2023.01) | |
| H01L 29/06 | (2006.01) | |
| H01L 29/423 | (2006.01) | |
| H01L 29/78 | (2006.01) | |

(52) U.S. Cl.
CPC ....... *H10B 10/125* (2023.02); *H01L 29/0673* (2013.01); *H01L 29/42392* (2013.01); *H01L 29/7853* (2013.01)

(58) Field of Classification Search
CPC ....... H01L 2029/7858; H01L 29/42392; H01L 29/785; H01L 29/1033; H01L 29/0653; H01L 29/0847; H01L 29/165; H01L 21/823456; H01L 21/823878; H01L 21/823807; H01L 21/823814; H01L 21/823821; H01L 21/823828; H10B 10/125

See application file for complete search history.

(56) References Cited

U.S. PATENT DOCUMENTS

| | | |
|---|---|---|
| 9,818,872 B2 | 11/2017 | Ching et al. |
| 9,887,269 B2 | 2/2018 | Ching et al. |
| 9,899,398 B1 | 2/2018 | Colinge et al. |
| 10,032,627 B2 | 7/2018 | Lee et al. |
| 10,109,721 B2 | 10/2018 | Lin et al. |
| 10,199,502 B2 | 2/2019 | Huang et al. |
| 10,290,546 B2 | 5/2019 | Chiang et al. |
| 10,475,902 B2 | 11/2019 | Lee et al. |

(Continued)

*Primary Examiner* — Changhyun Yi
(74) *Attorney, Agent, or Firm* — Haynes and Boone, LLP

(57) ABSTRACT

Semiconductor device and the manufacturing method thereof are disclosed. An exemplary semiconductor device includes a substrate including top portions isolated by an isolation structure, first semiconductor layers over a first top portion of the substrate in a first region, and a first gate structure wrapping each of the first semiconductor layers and covering a top surface and sidewalls of the first top portion of the substrate extending above the isolation structure. The first semiconductor layers are stacked up and separated from each other, and each first semiconductor layer has a first width. A bottom surface of the first gate structure is below the top surface of the substrate for a first depth which is at least half of the first width.

20 Claims, 29 Drawing Sheets

(56) References Cited

U.S. PATENT DOCUMENTS

| | | |
|---|---|---|
| 11,121,044 B2 | 10/2021 | Cheng |
| 11,152,510 B2 | 10/2021 | Zhang |
| 2018/0175036 A1 | 6/2018 | Ching et al. |
| 2019/0131394 A1 | 5/2019 | Reznicek |
| 2019/0181257 A1* | 6/2019 | Jeong ................... H01L 29/785 |
| 2020/0035563 A1* | 1/2020 | Zhang .............. H01L 29/66439 |
| 2020/0105751 A1 | 4/2020 | Dewey |
| 2020/0365692 A1* | 11/2020 | Jung .................. H01L 29/0653 |
| 2022/0231138 A1* | 7/2022 | Metz ................ H01L 29/42392 |

\* cited by examiner

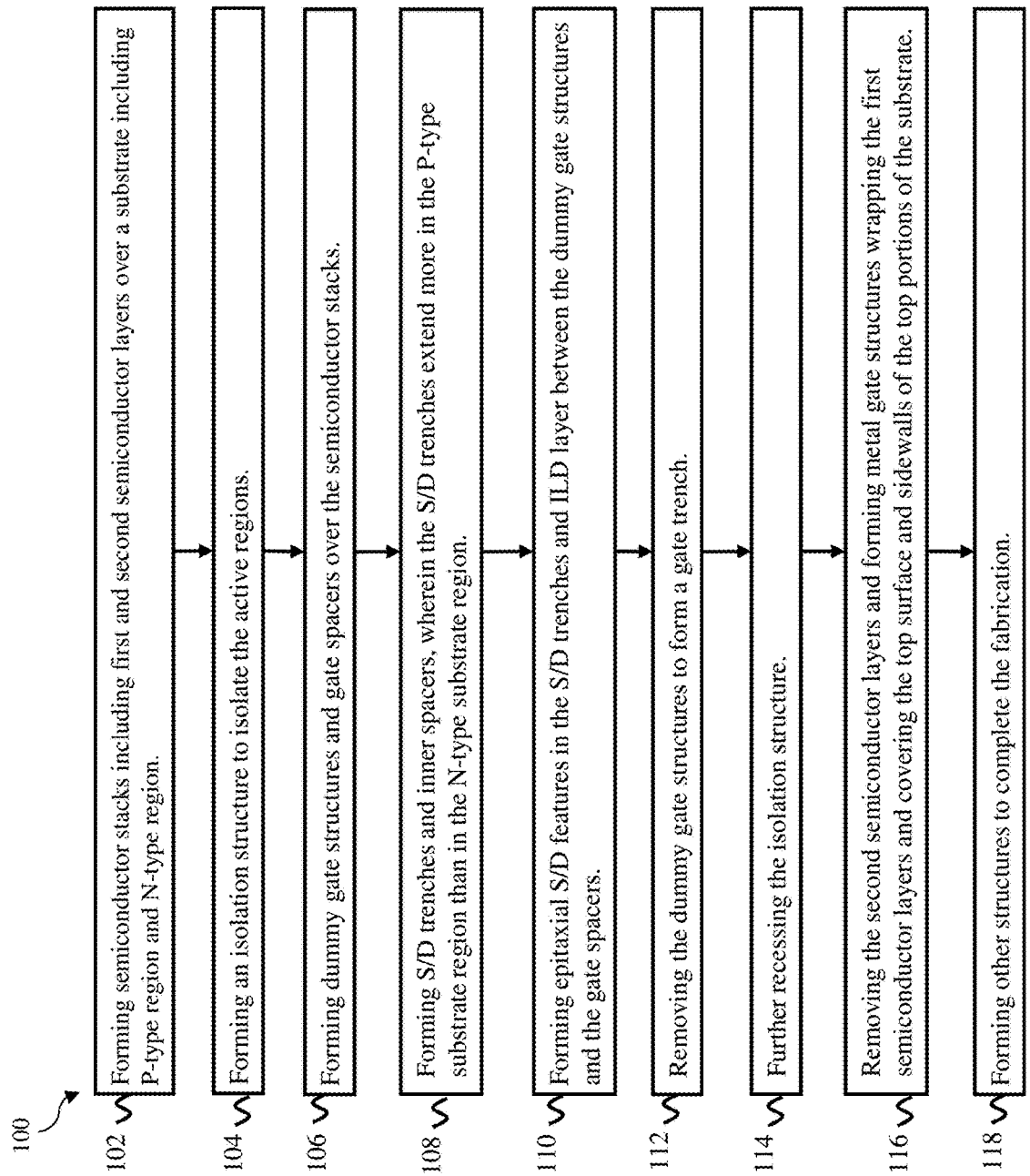

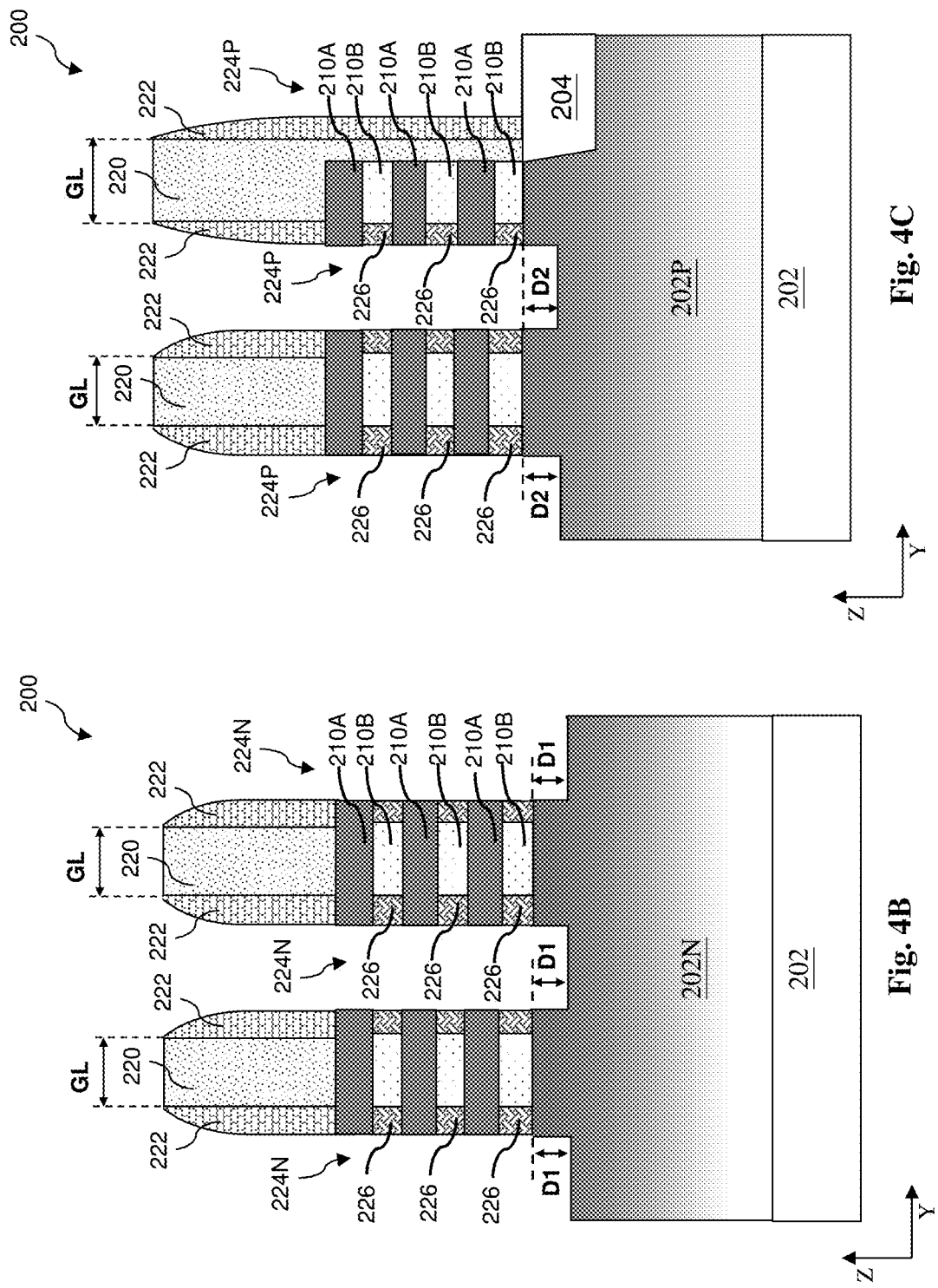

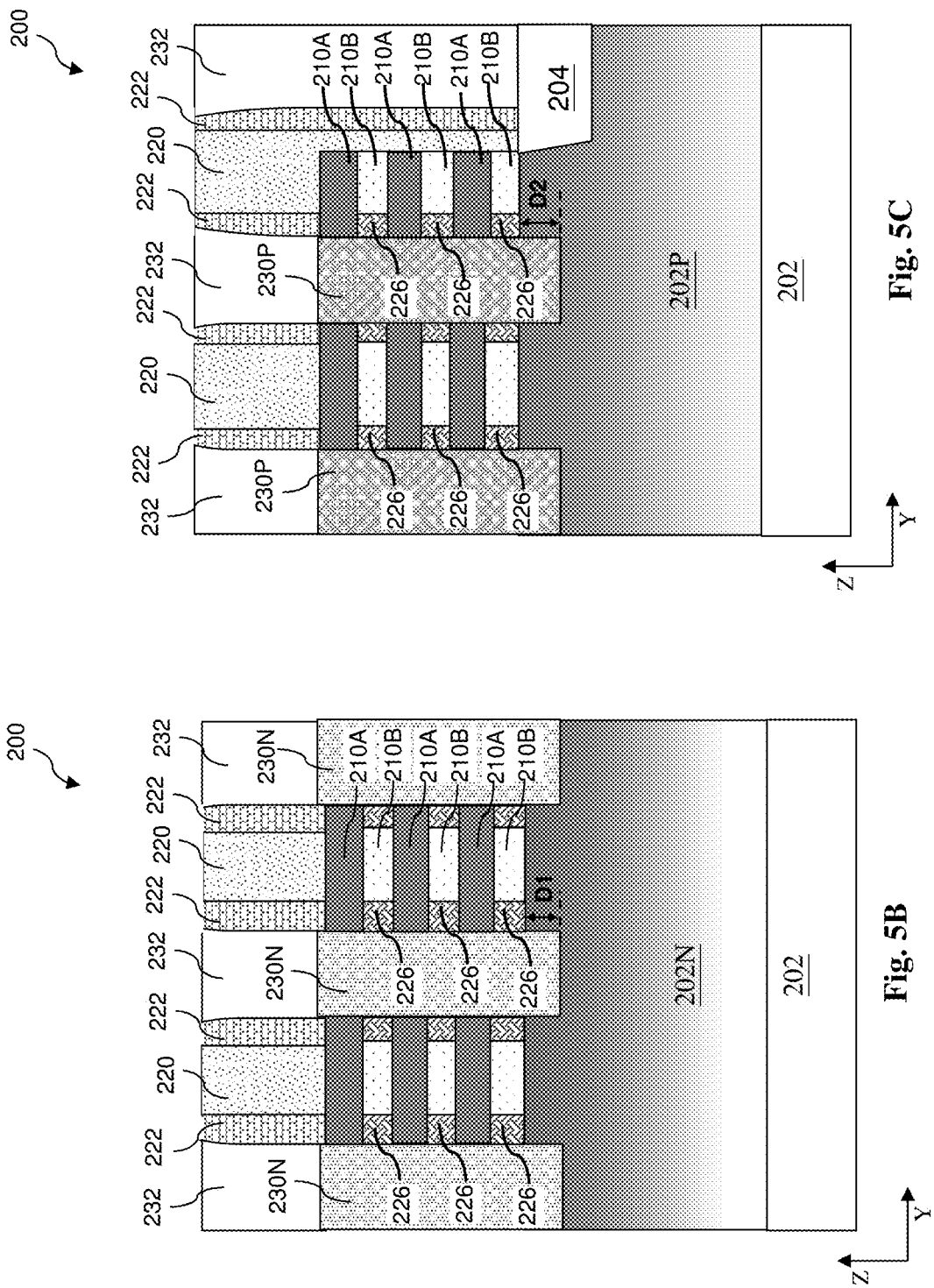

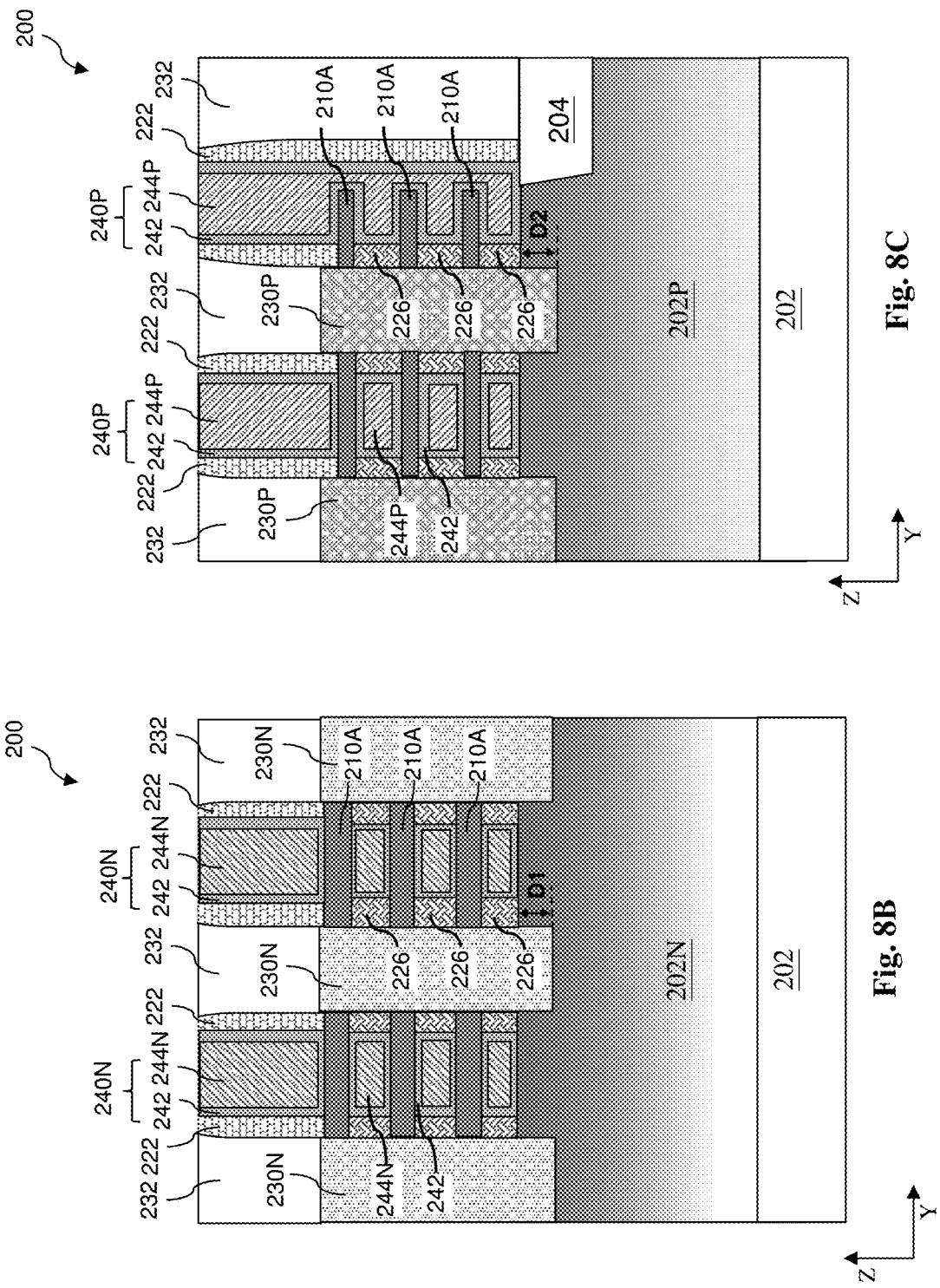

US 11,991,872 B2

1

SEMICONDUCTOR DEVICE WITH GATE RECESS AND METHODS OF FORMING THE SAME

PRIORITY DATA

This application is a divisional application of U.S. patent application Ser. No. 17/027,449, filed Sep. 21, 2020, the entirety of which is incorporated by reference.

BACKGROUND

The integrated circuit (IC) industry has experienced exponential growth. Three-dimensional multi-gate devices have been introduced to improve device performance. One such multi-gate device is a nanostructure device. A nanostructure device substantially refers to any device having a channel region including separated semiconductor channels, and a gate structure, or portions thereof, formed on more than one side of the semiconductor channels (for example, surrounding the semiconductor channels). In some instances, a nanostructure device is also called as a nanosheet device, a nanowire device, a nanoring device, a gate-surrounding device, a gate-all-around (GAA) device, or a multi-channel bridge device. Nanostructure transistors are compatible with conventional complementary metal-oxide-semiconductor (CMOS) fabrication processes and allow aggressive scaling down of device size. However, fabrication of nanostructure transistors presents challenges. For example, a static random-access memory (SRAM) cell fabricated by nanostructure are suffering with standby leakage issue and threshold voltage mismatch issue. Thus, improvement to the nanostructure device is needed

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flowchart of an example method 100 for making an example semiconductor device in accordance with some embodiments of the present disclosure.

FIGS. 3A-9A, 3B-9B, 3C-9C, 3D-9D illustrate cross-sectional views of 8 of the example SRAM cell along line A-A', B-B', C-C', D-D' in FIG. 2B, respectively, at intermediate stages of the method 100 of FIG. 1, in accordance with some embodiments of the present disclosure.

DETAILED DESCRIPTION

Figure 2A:
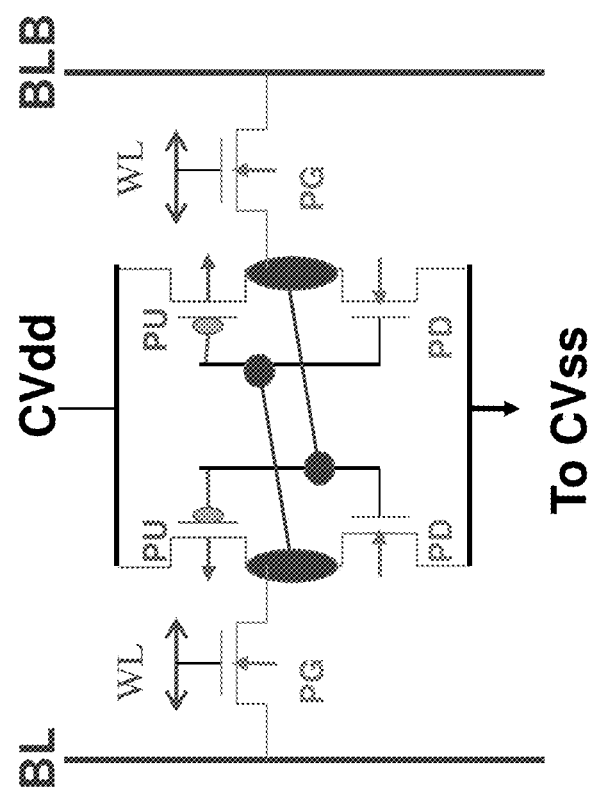
FIG. 2A illustrates a schematic view of a six-transistor (6T) SRAM cell.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as nanostructure FETs.

In a nanostructure device, a channel region of a single device may comprise multiple channel semiconductor layers stacked up and physically separated from one another. In some examples, a gate structure of the device (including a gate dielectric layer and a gate electrode) is disposed around (i.e. wraps) the channel semiconductor layers. The transistors formed by the gate structure wrapping the channel semiconductor layers (referred to as wrapping gate transistors (WGT)) can provide better gate control than conventional planar transistor and fin-like FET (FinFET). The bottom portion of the gate structure covers a portion of the top surface of the substrate instead of wrapping a channel semiconductor layer, and thereby forms a bottom planar transistor (BPT). The gate control of the BPT is not as good as the WGT. Thereby, the threshold voltage of the BPT is different than that of the WGT, which is referred to as a voltage mismatch issue that may degrade the performance of a SRAM device. In addition, the BPT may have a larger standby leakage (Ioff) which may cause more energy consumption in the standby status. Thus, the standby leakage is another concern of the SRAM device.

The present disclosure provides a semiconductor device with further gate recess than a conventional semiconductor device. In some embodiments, the gate structure extends to the substrate (i.e. a bottom surface of the gate structure is below a top surface of the substrate) for at least half of the channel width. Thereby, the BPT of the nanostructure device can provide extra sidewall gate control, and the voltage mismatch and the standby leakage issues can be mitigated. The extra sidewall gate control also allows lower APT dosage for junction leakage reduction and thus can mitigate the APT dopant out-diffusion impact. In some further embodiments, the P-type epitaxial S/D feature (for example, comprising silicon germanium) is deeper recessed than the N-type epitaxial S/D feature, thereby the P-type epitaxial S/D feature can provide more strain for P-type transistors which is benefit for the on current (Ion) improvement. The performance and the reliability of the semiconductor device can thus be improved.

Figure 2B:
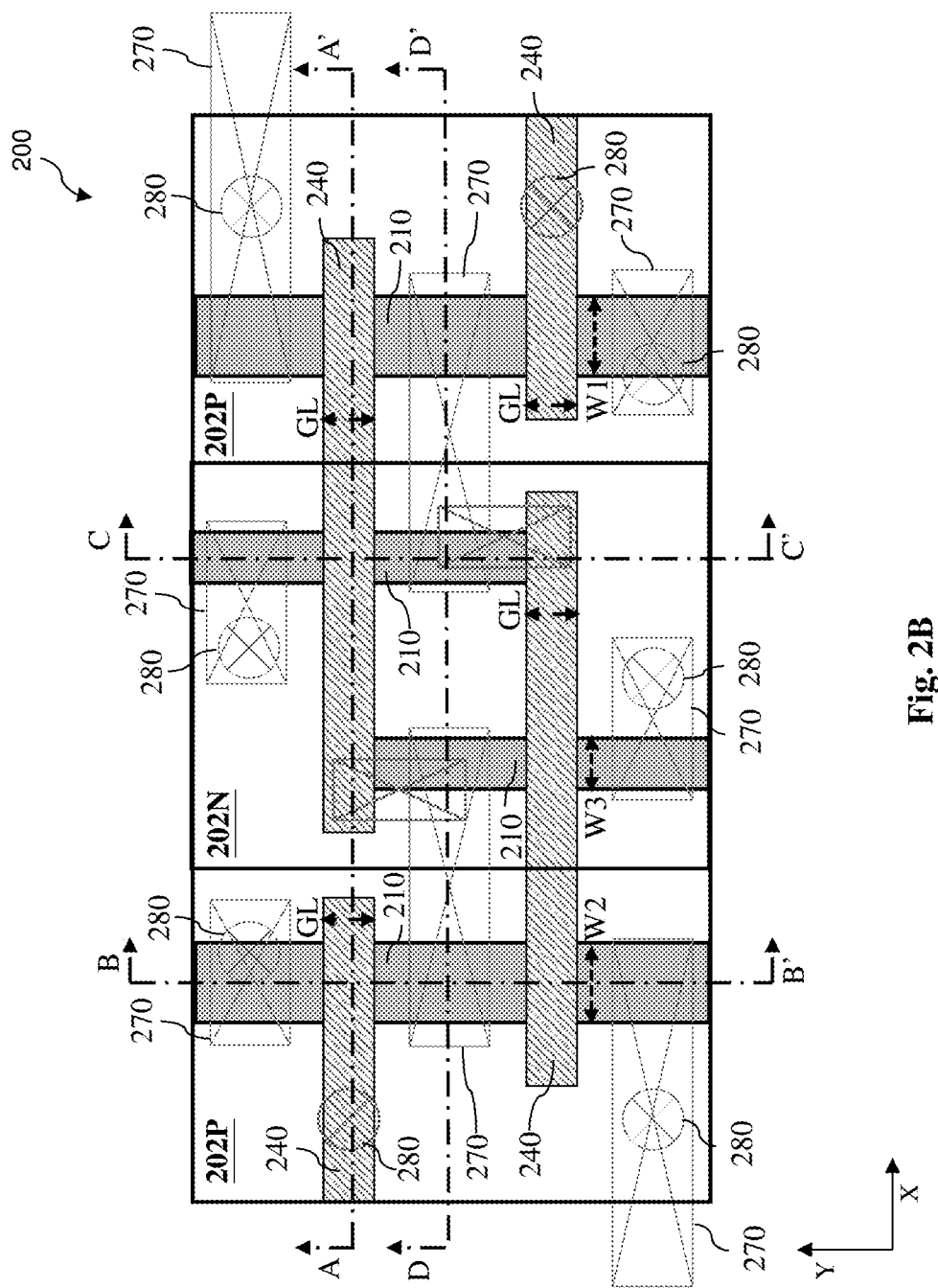
FIG. 2B illustrates a top view of the example SRAM cell in accordance with an embodiment of the present disclosure.

FIG. 1 shows a flow chart of a method 100 for making an example semiconductor device (for example, the SRAM cell 200 or the logic cell 300) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. FIG. 2A illustrates a schematic view of a six-transistor (6T) SRAM cell. FIG. 2B illustrates a top view of an example SRAM cell 200 according to an embodiment of the present disclosure. FIGS. 3A-3D to 9A-9D illustrate cross-section views of the SRAM cell 200 at intermediate stages of method 100, in accordance with some embodiments of the present disclosure. FIGS. 10 and 11A-11D illustrate a top view and cross-sectional views of an example logic cell 300 in accordance with another embodiment of the present disclosure.

The example semiconductor device is not limited to the SRAM cell 200 or the logic cell 300. The example semiconductor device may be an intermediate device fabricated during processing of an integrated circuit (IC), or a portion thereof, that may comprise SRAM and/or other logic circuits, passive components such as resistors, capacitors, and inductors, and active components such as P-type FETs (PFETs), N-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. The example semiconductor device can be a portion of a core region (often referred to as a logic region), a memory region, an analog region, a peripheral region (often referred to as an input/output (I/O) region), a dummy region, other suitable region, or combinations thereof, of an integrated circuit (IC). In some embodiments, the example semiconductor device may be a portion of an IC chip, a system on chip (SoC), or portion thereof. The present disclosure is not limited to any particular number of devices or device regions, or to any particular device configurations.

As illustrated in FIG. 2A, a 6T SRAM cell typically includes two P-type pull-up (PU) transistors, two N-type pull-down (PD) transistors, and two N-type pass-gate (PG) transistors. The PD transistors form cross-coupled inverters with the PU transistors. The two inverters are cross-coupled to form data storage nodes. The PG transistors are coupled to the data storage nodes for writing thereto and reading therefrom. FIG. 1 further shows word line (WL), bit line (BL), and bit line bar (BLB) for accessing the data storage nodes of the SRAM cell 200, and positive power supply CVdd and negative power supply (or ground) CVss. FIG. 2B illustrates a top view of a SRAM cell 200.

Referring to FIGS. 1 and 3A-3D, at operation 102, a start structure of the SRAM cell 200 is received. The start structure of the SRAM cell 200 comprises a substrate 202. In some embodiments, the substrate 202 is a bulk silicon (Si) substrate. Alternatively or additionally, the substrate 202 includes another single crystalline semiconductor, such as germanium (Ge); a compound semiconductor; an alloy semiconductor; or combinations thereof. In some embodiments, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrate can be fabricated using separation by implantation of oxygen (SIMOX), wafer bonding, and/or other suitable methods.

The substrate 202 includes various doped regions configured according to design requirements of the SRAM cell 200. In some embodiments, the substrate 202 includes regions 202N for N-type FET doped with P-type dopants (i.e. P-type wells). In some embodiments, the P-type dopants include boron (for example, BF2), indium, other P-type dopant, or combinations thereof. The substrate 202 also includes regions 202P for P-type FET doped with N-type dopants (i.e. N-type wells). In some embodiments, the N-type dopants include phosphorus, arsenic, other N-type dopant, or combinations thereof. The various doped regions can be formed directly on and/or in substrate 202 by various implant process.

In some embodiments, the top portion of the substrate 202 may include some anti-punch through (APT) dopants to mitigate the punch through issues between the source and drain regions. An implant process may be performed to implant a dopant (such as boron, BF2, indium, carbon, nitrogen, or combinations thereof) to the top portions of the regions 202N for the N-type FET or a dopant (such as phosphorous, arsenic, carbon, nitrogen, or combinations thereof) to the top portions of the regions 202P for the P-type FET, to enhance the anti-punch through capability of the SRAM cell 200. Due to the extra sidewall gate control of the BPT in the present disclosure, the APT dosage to the top portions of the substrate can be less than the conventional nanostructure device, while keep the same or even better junction leakage reduction. The less dosage of the APT dopant can mitigate the APT dopant out-diffusion impact, which is benefit to the voltage mismatch performance.

Alternative semiconductor layers 210A and 210B are then formed over the substrate 202. In some embodiments, the semiconductor layers 210A includes a first semiconductor material and the semiconductor layers 210B includes a second semiconductor material which is different from the first semiconductor material. The different semiconductor materials of the semiconductor layers 210A and 210B have different oxidation rates and/or different etch selectivity. In some embodiments, the semiconductor material of the semiconductor layers 210A is the same as the substrate 202. In the depicted embodiment, the semiconductor layers 210A comprise silicon (Si, like the substrate 202), and the semiconductor layers 210B comprise silicon germanium (SiGe). Thus, alternating SiGe/Si/SiGe/Si . . . layers are arranged from bottom to top over the substrate 202. In some embodiments, the material of the top semiconductor layer may or may not be the same as the bottom semiconductor layer. The number of the semiconductor layers 210A and 210B depends on the design requirements of the SRAM cell 200. For example, it may comprise two to ten layers of semiconductor layers 210A or 210B each. In some embodiments, different semiconductor layers 210A and 210B have the same thickness in the Z-direction. In some other embodiments, different semiconductor layers 210A and 210B have different thicknesses. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, a metalorganic chemical vapor deposition (MOCVD) process, other suitable epitaxial growth process, or combinations thereof.

Figure 3A:
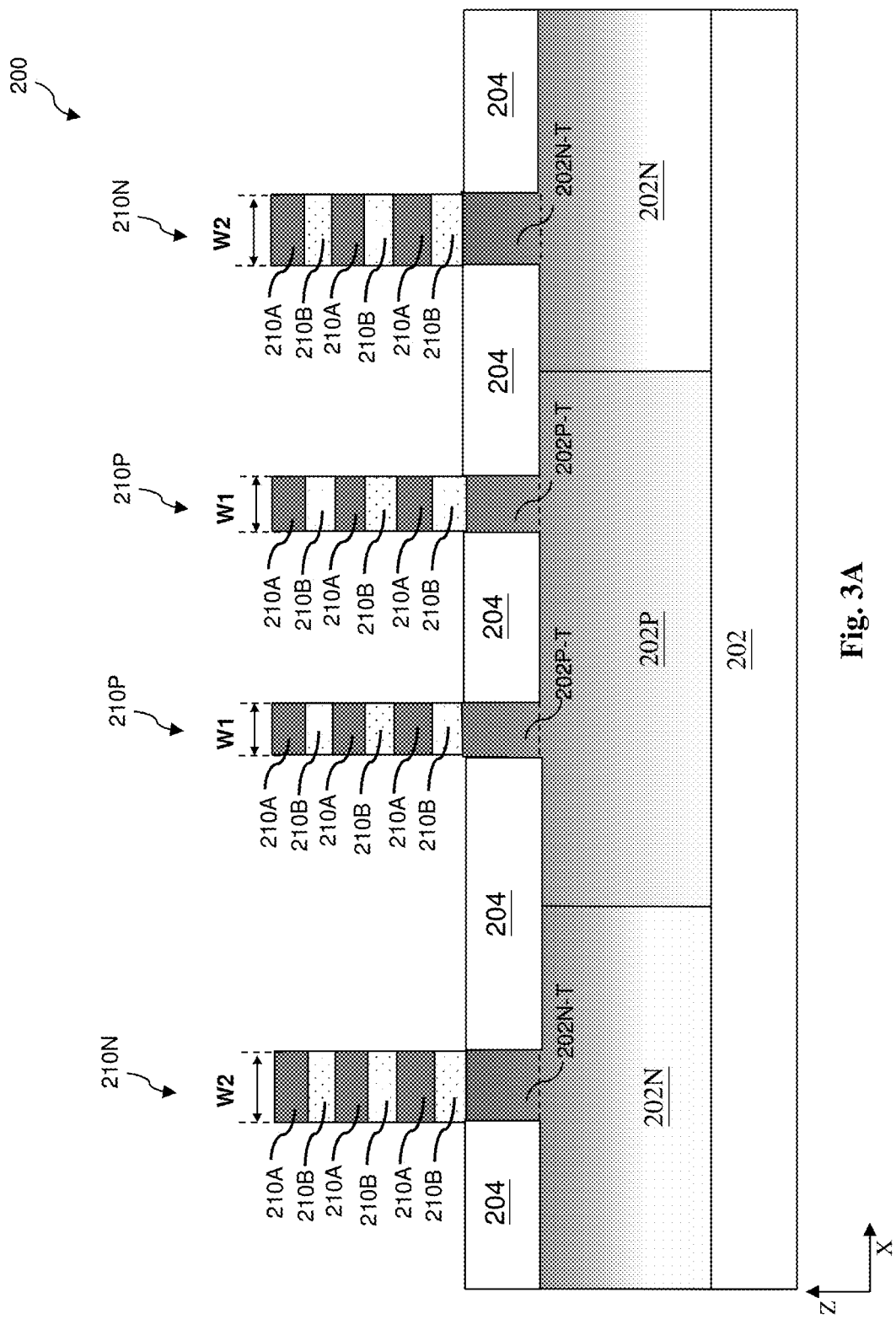
Figure 3C:
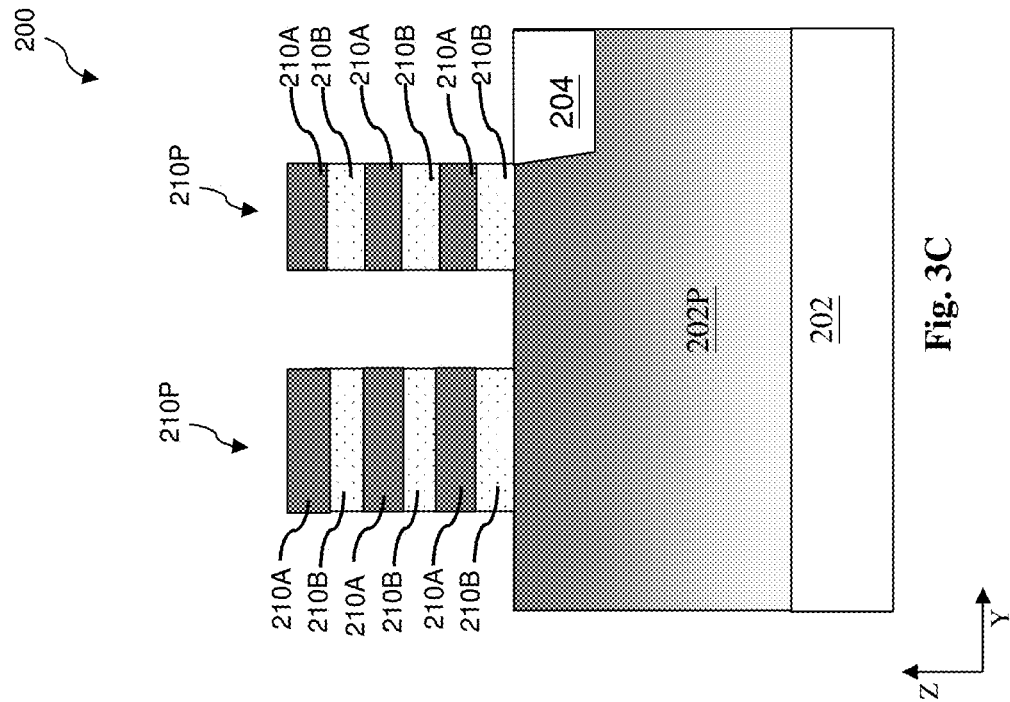
Figure 3B:
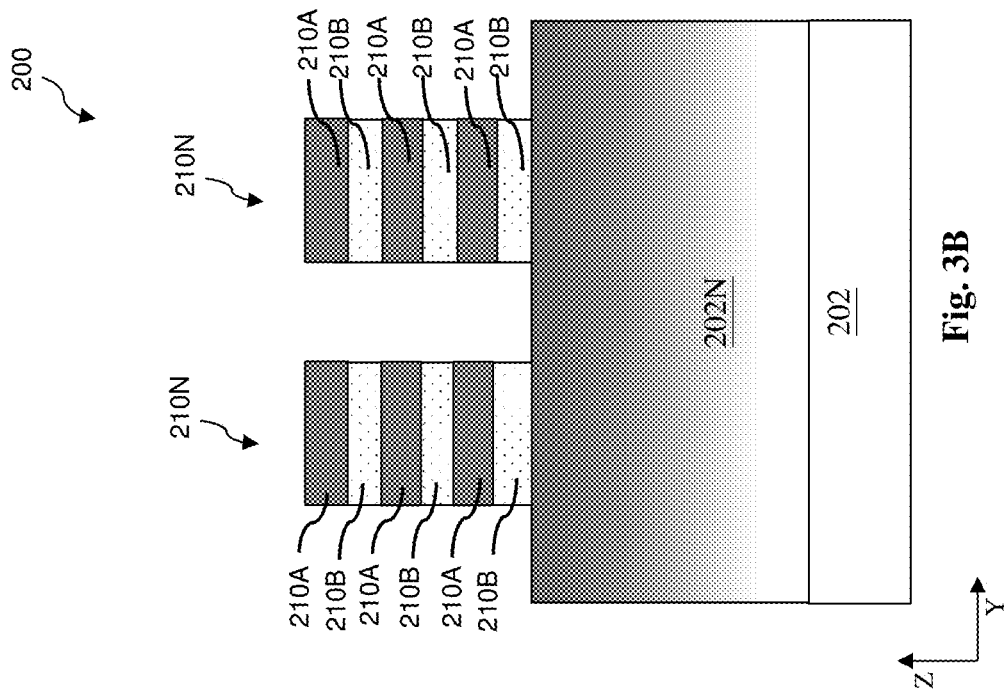
Figure 3D:
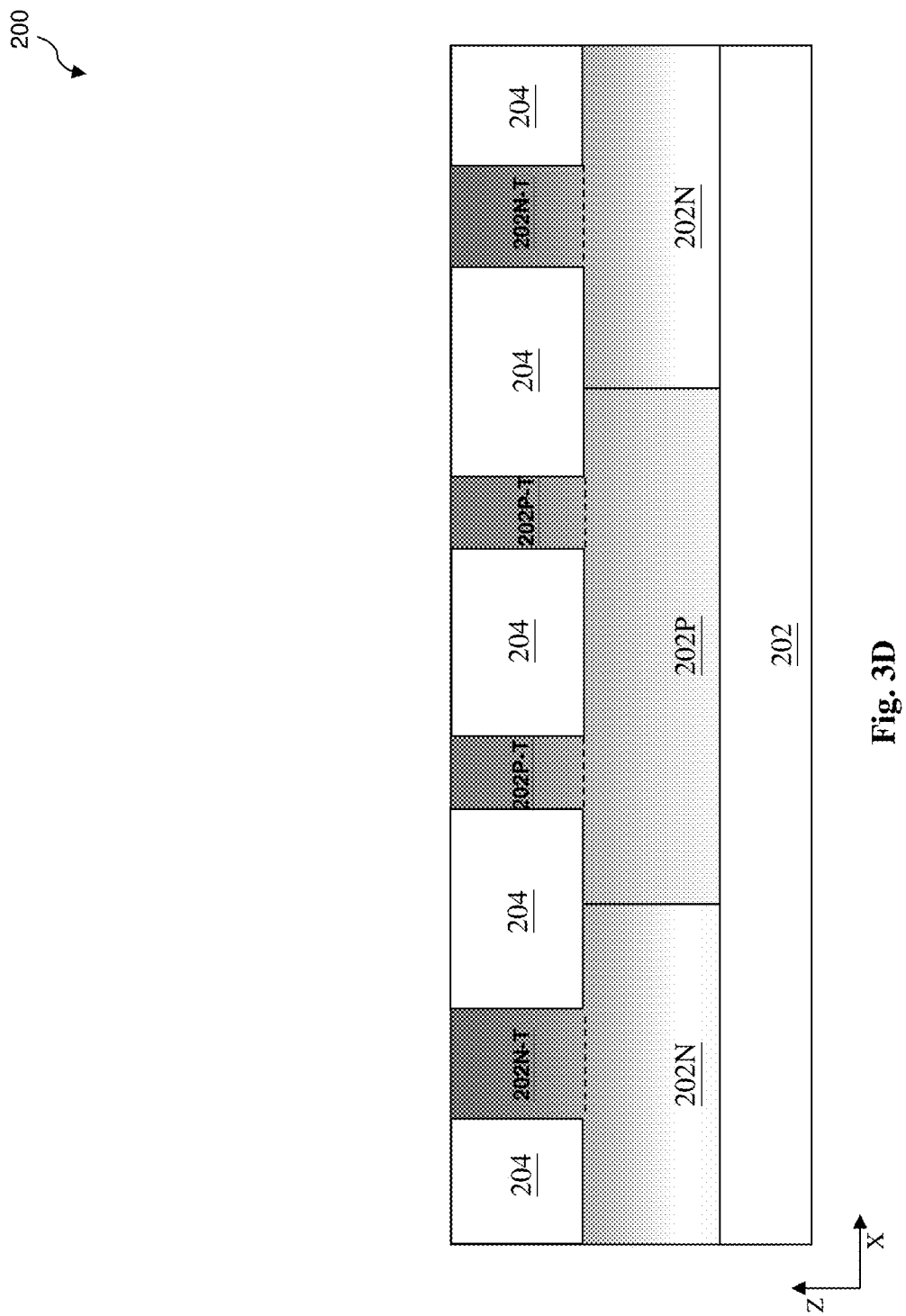

The alternating semiconductor layers 210A and 210B are then patterned to form the semiconductor stacks 210N and 210P in the regions 202N and 202P, respectively. Both of the semiconductor stacks 210N and 210P refer to as the semiconductor stacks 210 (hereinafter, the stacks 210). Photoresist and etching processes may be performed to the semiconductor layers 210A and 210B to form the fin-shape stacks 210 as illustrated in FIGS. 3A-3C. For example, first, a patterned photoresist mask is formed over the substrate 202. The patterned photoresist mask covers the fin positions according to the design requirement of the SRAM cell 200. Subsequently, one or more etching processes are performed using the patterned photoresist mask to form the stacks 210. The etching process includes dry etching, wet etching, other suitable etching process, or combinations thereof. The photoresist mask is then removed by any proper method (such as an ashing process). Trenches are then formed between the stacks 210. In the depicted embodiment, the one or more etching processes remove, along the patterned photoresist mask, the semiconductor layers 210A, 210B, as well as some top portions of the substrate 202 to form the fin-shape stacks 210. In other words, the stack 210N includes semiconductor layers 210A, 210B, and the remained top portions 202N-T of the substrate (i.e. the N-type top substrate portions 202N-T); and the stack 210P includes semiconductor layers 210A, 210B, and the remained top portions 202P-T of the substrate (i.e. the P-type top substrate portions 202N-P). Referring to FIG. 3A, a width W1 (in the X-direction) of the stack 210P is less than a width W2 (in the X-direction) of the stack 210N. In some embodiments, the width W1 is about 4 nm to about 10 nm, and the width W2 is about 6 nm to about 20 nm. Each of the stack 210 includes a channel region, and a source region and a drain region interposed by the channel region. The width W1 and W2 are also referred to as the channel width of the nanostructure transistors.

Still referring to FIGS. 1 and 3A-3D, at operation 104, an isolation structure 204 (e.g., a shallow trench isolation (STI) structure) is formed in the trenches between the stacks 210 to separate and isolate the active regions and/or passive regions of the SRAM cell 200. In some embodiments, one or more dielectric materials, such as silicon dioxide, silicon nitride, and/or silicon oxynitride, other suitable isolation material (for example, including silicon, oxygen, nitrogen, carbon, or other suitable isolation constituent), is deposited in the trenches between the stacks 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 204.

Figure 4A:
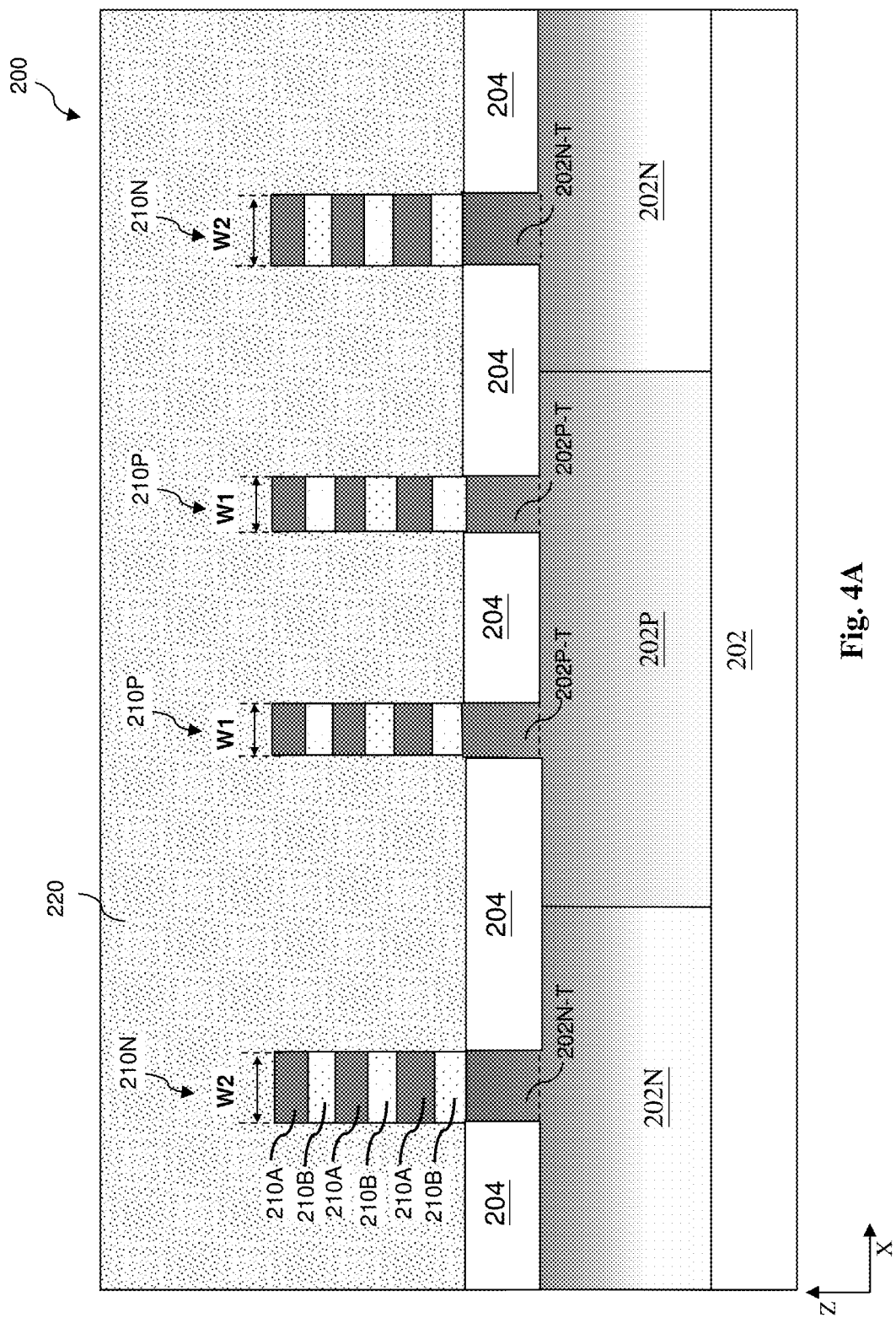
Figure 4D:
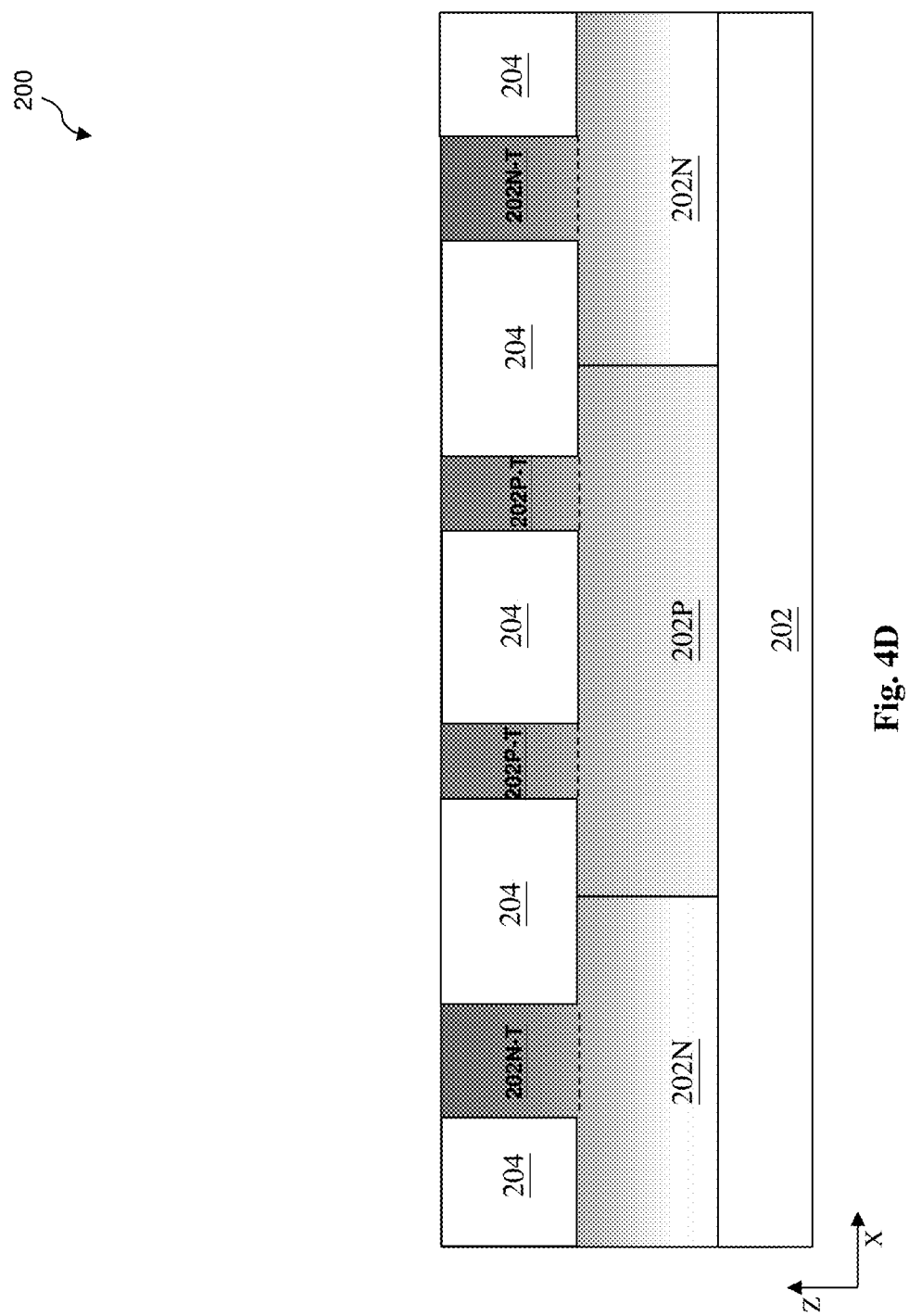
Figure 5A:
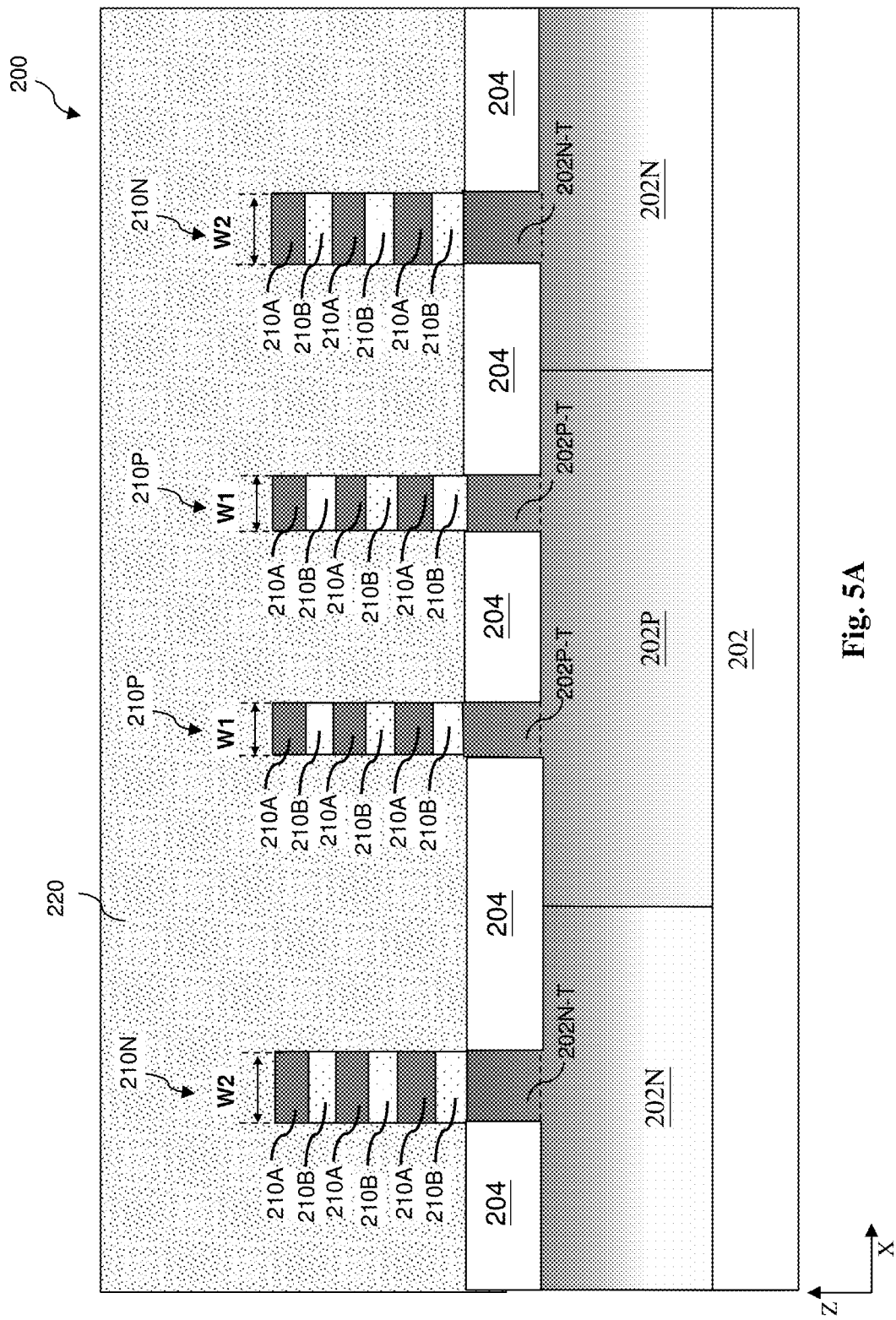
Figure 5D:
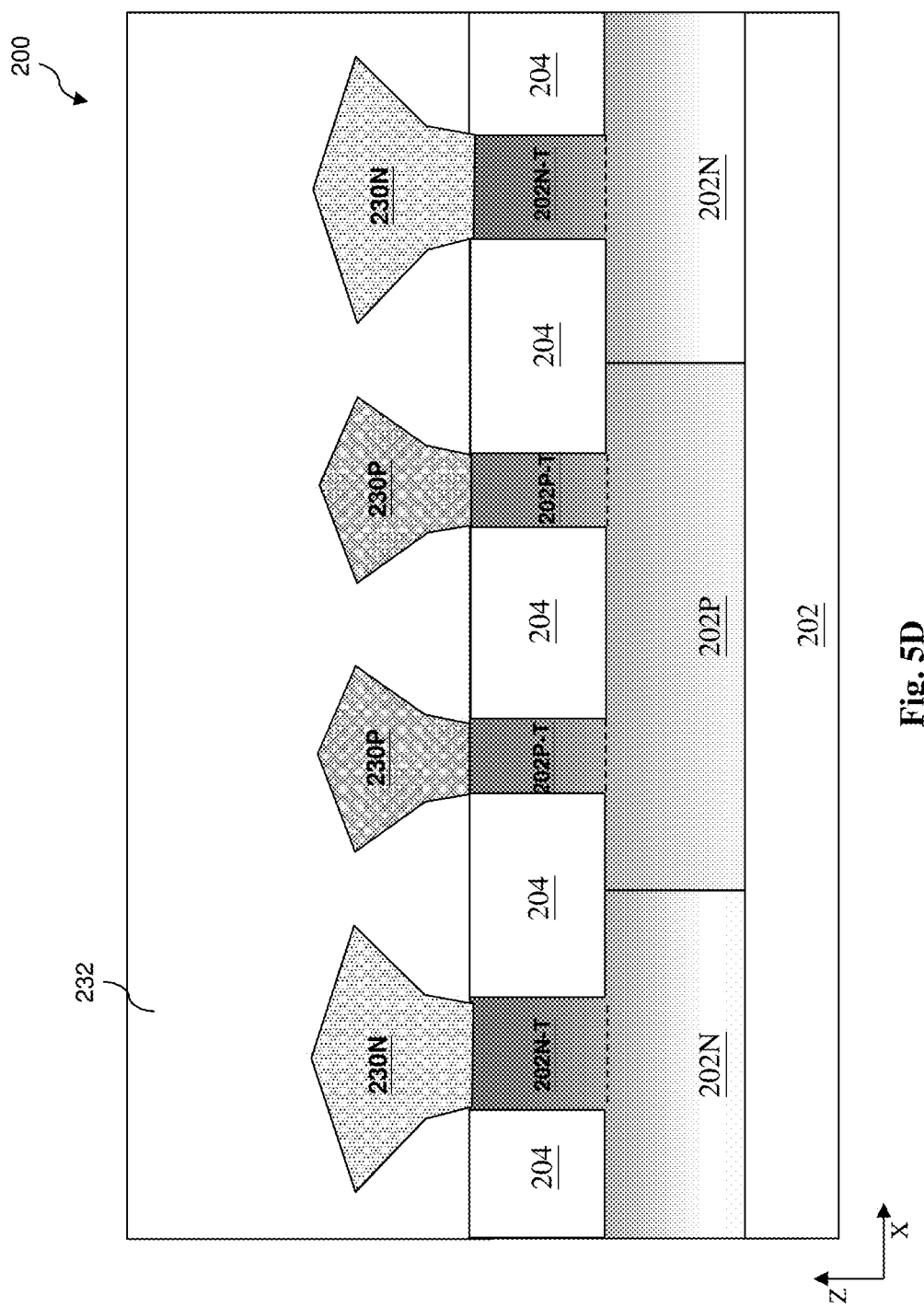

Now, referring to FIGS. 1 and 4A-4D, at operation 106, dummy gate structures 220 are formed over the stacks 210. Each dummy gate structure 220 serves as a placeholder for subsequently forming a metal gate structure. The dummy gate structures 220 extend along the X-direction and traverse respective stacks 210. The dummy gate structures 220 cover the channel regions of the stacks 210 which interpose the source regions and the drain regions. Each dummy gate structure 220 may include various dummy layers. In some embodiments, the dummy gate structure 220 may include an interfacial layer (for example, including silicon oxide) disposed over the stack 210 and the isolation structure 204, a dummy gate electrode (for example, including polysilicon) disposed over the interfacial layer, one or more hard mask layers (for example, including a dielectric material such as silicon nitride, silicon carbonitride, silicon oxide, etc.) over the dummy gate electrode, and/or other suitable layers. The dummy gate structures 220 are formed by deposition processes, lithography processes, etching processes, other suitable processes, or combinations thereof. For example, different dummy layers are deposited over the stacks 210 and the isolation structure 204. A lithography process is then performed to form a mask covering the channel regions of the stack 210. Thereafter, the different dummy layers are etched using the lithography mask to form the dummy gate structures 220. And, the lithography mask is then removed using any proper method (such as an ashing process). Referring to FIGS. 4B and 4C, each dummy gate structure 220 has a length GL (in the Y-direction). In some embodiments, the gate length GL is about 4 nm to about 30 nm.

Still at operation 106, gate spacers 222 are formed along the sidewalls of the dummy gate structures 220 over the stack 210. In some embodiments, the gate spacers 222 comprise a dielectric material, such as silicon oxide, silicon nitride, carbon doped oxide, nitrogen doped oxide, porous oxide, or a combination thereof. The gate spacers 222 are formed by any suitable process(es). For example, first, a spacer layer comprising the dielectric material is deposited (for example, by atomic layer deposition (ALD), CVD, PVD, or other proper process) along sidewalls and over top surfaces of the dummy gate structures 220. Subsequently, the spacer layer is anisotropically etched to remove the portions in the X-Y plane (the plane in which the top surface of the substrate 202 is). The remaining portions of the spacer layer then become the gate spacers 222. In some embodiments, the gate spacers 222 has a width about 3 nm to about 12 nm in the Y-direction.

Thereafter, still referring to FIGS. 1 and 4A-4D, at operation 108, source/drain (S/D) trenches 224N and 224P (both referred to as the S/D trenches 224) are formed over the S/D regions of the stacks 210. Referring to FIGS. 4B and 4C, the S/D regions of the stack 210 are recessed along the sidewalls of the gate spacers 222 to form the S/D trenches 224. In some embodiments, the S/D regions of the stack 210 are recessed by S/D etching process(es), which can be a dry etch (such as a reactive ion etching (RIE) process), a wet etch, or combinations thereof. The duration of the S/D etching process is controlled such that the bottom surfaces of the S/D trenches 224N and 224P are below the top surface of the substrate 202 (i.e. the bottom surface of the lowermost semiconductor layer 210B). In some embodiments, the N-type S/D trenches 224N and the P-type S/D trenches 224P are formed in different steps such that a depth D1 (in the Z-direction) of the N-type S/D trenches 224N below the top surface of the substrate 202 is less than a depth D2 (in the Z-direction) of the P-type S/D trenches 224P below the top surface of the substrate 202. For example, first, a mask is formed to cover the P-type region 202P, such that the S/D etching process is only performed in the N-type region 202N to form the S/D trenches 224N; and after removing the mask covering the P-type region 202P, another mask is formed to cover the N-type region 202N, such that the S/D etching process is only performed in the P-type region 202P to form the S/D trenches 224P. And, vice versa. In some embodiments, the depth D1 is about 5 nm to about 40 nm, the depth D2 is about 5 nm to about 50 nm, and the depth D2 is greater than the depth D1 for about 5 nm to about 30 nm.

Still referring to FIGS. 1 and 4A-4D, at operation 108, inner spacers 226 are formed between the edges of the semiconductor layers 210A. Since the bottom surfaces of the S/D trenches 224 are below the top surface of the substrate, the sidewalls of all the semiconductor layers 210A and 210B are completely exposed in the S/D trenches 224. The enough exposure can provide better quality and efficiency of the inner spacer formation. In some embodiments, the exposed portions (edges) of the semiconductor layers 210B in the S/D trenches 224 are selectively removed by a suitable etching process to form gaps between the semiconductor layers 210A. In other words, edges of the semiconductor layers 210A are suspended in the S/D trenches 224. Due to the different oxidation rates and/or etching selectivities of the materials of the semiconductor layers 210B (for example, SiGe) and 210A (for example, Si), only exposed portions (edges) of the semiconductor layers 210B are removed, while the semiconductor layers 210A remain substantially unchanged. In some embodiments, the selective removal of the exposed portions of the semiconductor layers 210B may include an oxidation process followed by a selective etching process. For example, the edge portions of the semiconductor layers 210B are first selectively oxidized to include a material of SiGeOx. Then, a selective etching process is performed to remove the SiGeOx with a suitable etchant such as ammonium hydroxide (NH4OH) or hydro fluoride (HF). The duration of the oxidation process and the selective etching process can be controlled such that only edge portions of the semiconductor layers 210B are selectively removed.

Thereafter, inner spacers 226 are formed to fill in the gaps between the semiconductor layers 210A. The inner spacers 226 comprise a dielectric material having a higher K value than the gate spacers 222. For example, the inner spacers 226 include a material such as silicon oxide, silicon nitride, silicon oxynitride, silicon oxycarbide, or combinations thereof. The dielectric material of the inner spacers may be deposited in the S/D trenches 224 and in the gaps between the edges of the semiconductor layers 210A by ALD, CVD, PVD, or combinations thereof. Extra dielectric material is then removed along sidewalls of the gate spacers 222 until the sidewalls of the semiconductor layers 210A are exposed in the S/D trenches 224. In some embodiments, the inner spacers 226 has a thickness of about 3 nm to about 12 nm in the Y-direction.

Now referring to FIGS. 1 and 5A-5D, at operation 110, epitaxial S/D features 230N and 230P (both referred to as S/D features 230) are formed in the S/D trenches 224N and 224P, respectively. In some embodiments, the N-type S/D features 230N include silicon and can be doped with carbon, phosphorous, arsenic, other N-type dopant, or combinations thereof (for example, forming Si:C epitaxial S/D features, Si:P epitaxial S/D features, or Si:C:P epitaxial S/D features). In some embodiments, the P-type S/D features 230P include silicon germanium or germanium and can be doped with boron, other P-type dopant, or combinations thereof (for example, forming Si:Ge:B epitaxial S/D features). An epitaxy process may be implemented to epitaxially grow the S/D features 230 from the substrate 202 and the exposed semiconductor materials (i.e. edge portions of the semiconductor layers 210A) in the S/D trenches 224. The epitaxy process includes CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. In some embodiments, the epitaxial S/D features 230 may comprise multiple epitaxial semiconductor layers, and different epitaxial semiconductor layers are different in amount of dopant comprised therein. The N-type dopants and/or the P-type dopants of the S/D features 230 may diffuse into the edge portions of the semiconductor layers 210A, and thereby form low doped edge regions of the semiconductor layers 210A.

Referring to FIGS. 5B and 5C, the N-type S/D features 230N extends to the portion 202N of the substrate for a depth D1, the P-type S/D features 230P extends to the portion 202P of the substrate for a depth D2. In other words, the bottom surfaces of the N-type S/D features 230N below the top surface of the substrate 202 for a depth D1, and the bottom surfaces of the P-type S/D features 230P below the top surface of the substrate 202 for a depth D2. In some embodiments, the depth D2 is greater than D1 for at least 5 nm. For example, the depth D1 is about 5 nm to about 40 nm, the depth D2 is about 5 nm to about 50 nm, and the different between the depth D1 and D2 is about 5 nm to about 30 nm. Therefore, the P-type S/D features 230P has a bigger size than the N-type S/D features 230N, the material of the P-type S/D features 230P (for example, Si:Ge:B) can provide more strain for the P-type transistor for Ion improvement.

Thereafter, still referring to FIGS. 1 and 5A-5D, at operation 110, an interlayer dielectric (ILD) layer 232 is disposed between adjacent dummy gate structures 220 and gate spacers 222. In some embodiments, the ILD layer 232 includes a dielectric material including, for example, silicon oxide, silicon nitride, silicon oxynitride, tetraethylorthosilicate (TEOS) formed oxide, phosphosilicate glass (PSG), borophosphosilicate glass (BPSG), low-k dielectric material (K<3.9), other suitable dielectric material, or combinations thereof. The ILD layer 232 may be formed by a deposition process (such as CVD, PVD, ALD, plating, other suitable methods, or combinations thereof). In some embodiments, a CMP process and/or other planarization process can be performed until reaching (exposing) the dummy gate electrodes of the dummy gate structures 220.

Now referring to FIGS. 1 and 6A-6D, at operation 112, the dummy gate structures 220 are removed to form gate trenches 236 exposing the channel regions of the stacks 210. In some embodiments, removing the dummy gate structures 220 comprises one or more etching processes, such as wet etch, dry etch (e.g. reactive-ion etching (RIE)), or other etching techniques. The semiconductor layers 210A and 210B, the top surfaces of the top substrate portions 202N-T and 202P-T, and portions of the sidewalls of the top substrate portions 202N-T and 202P-T are exposed in the gate trenches 236.

Figure 6A:
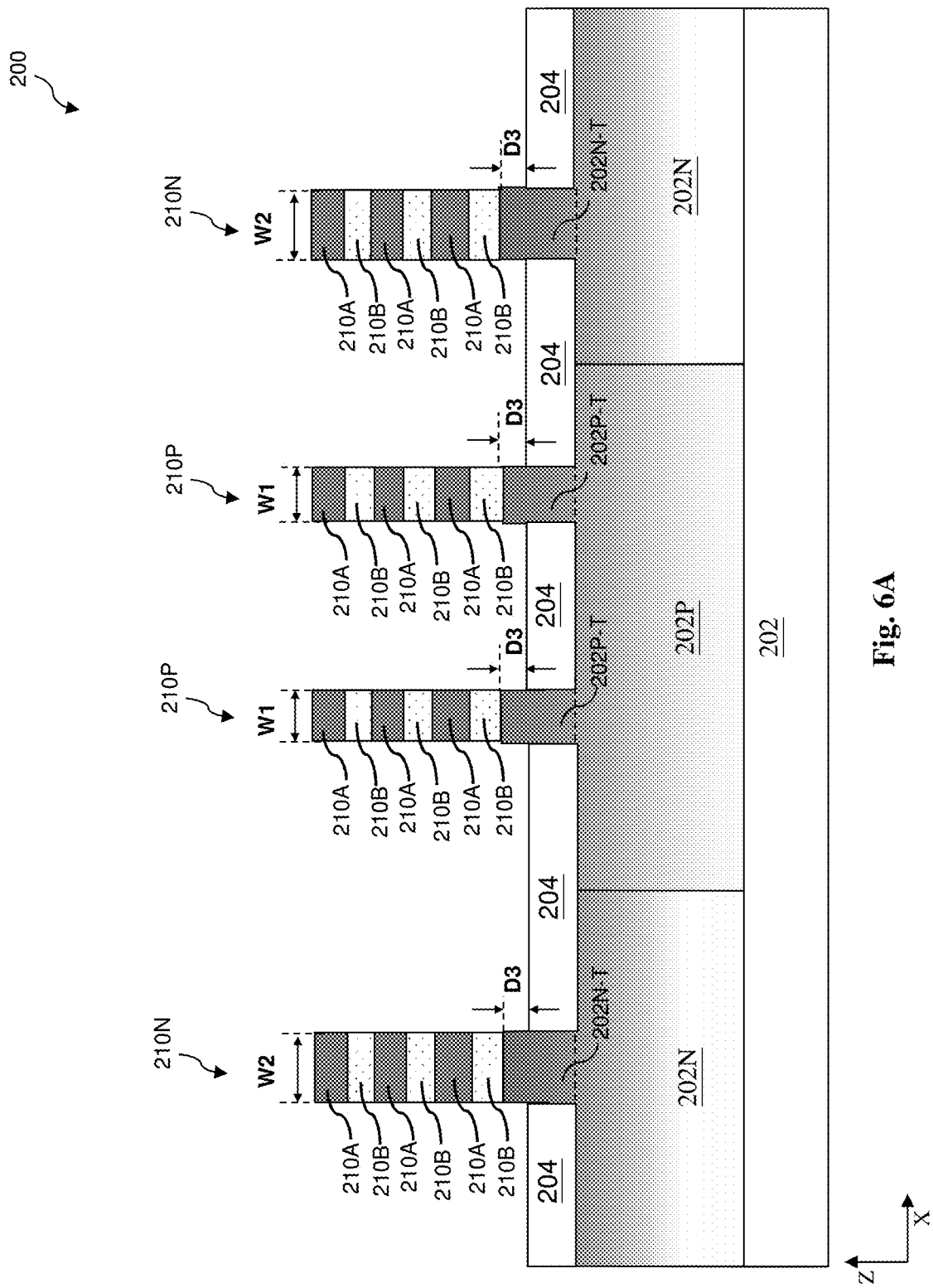
Figure 6C:
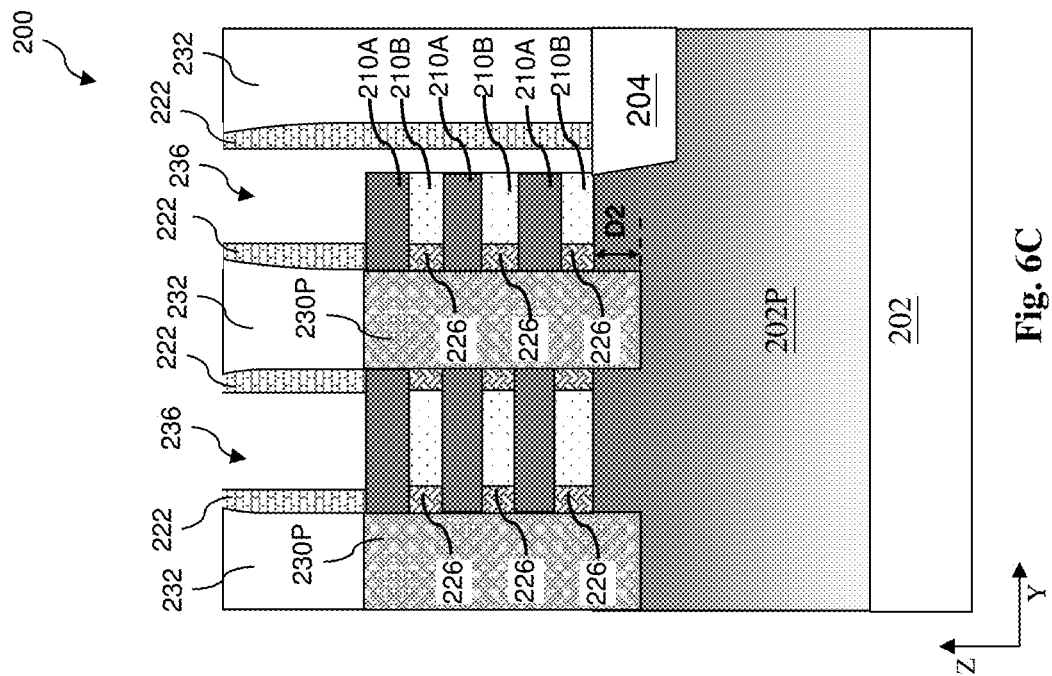
Figure 6B:
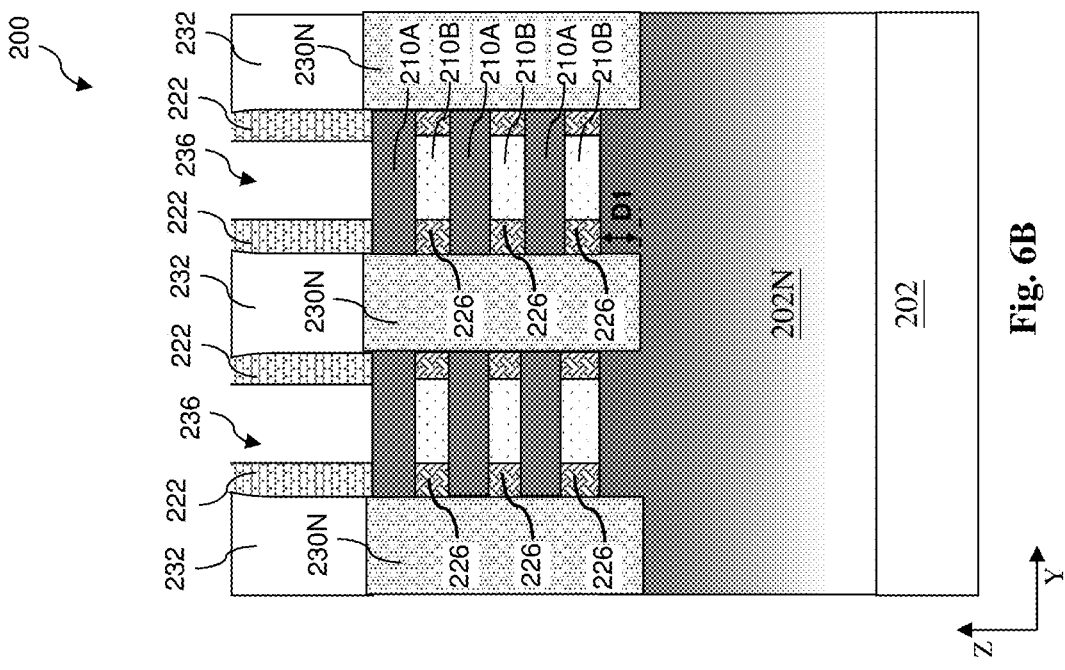
Figure 6D:
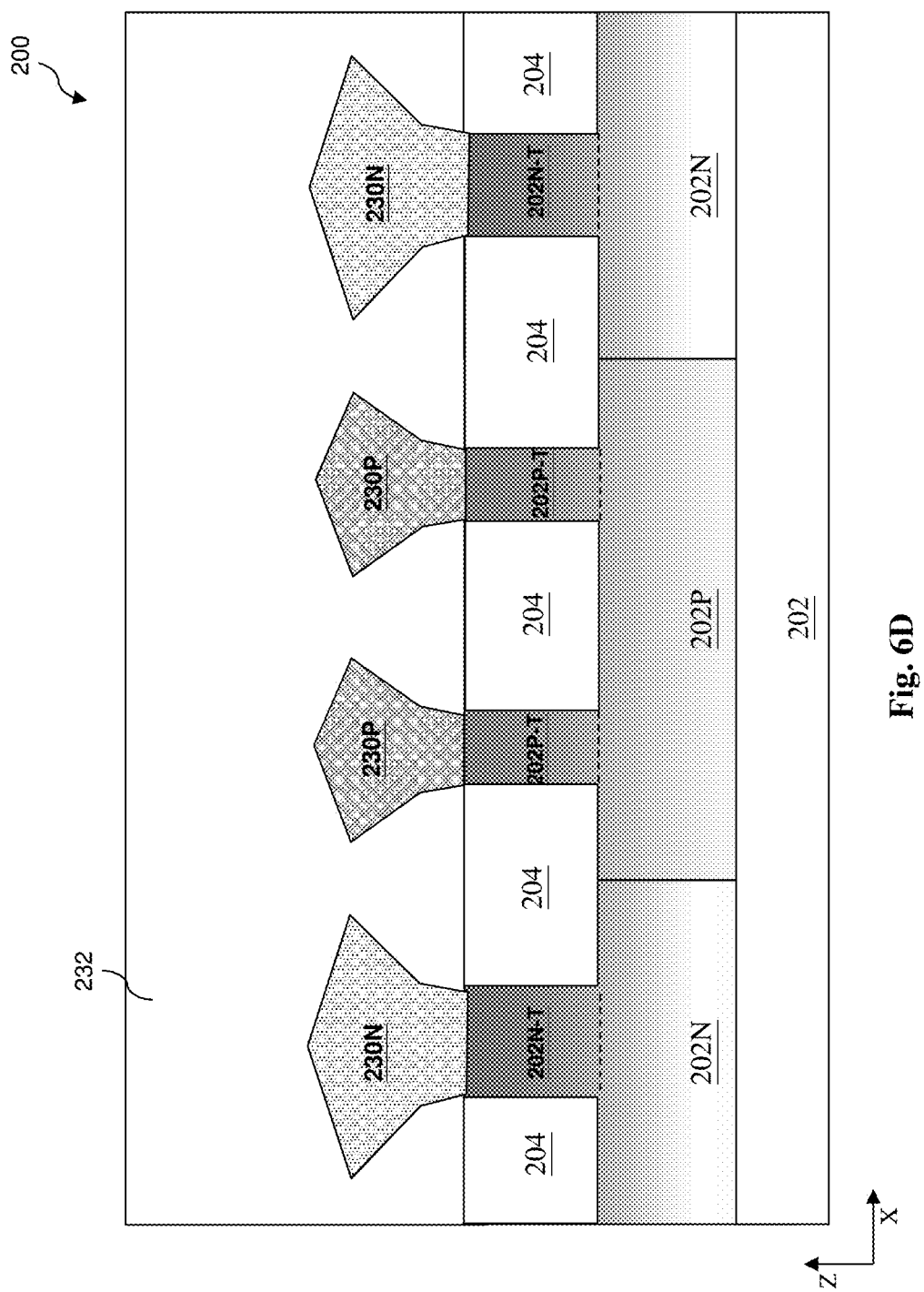

Still referring to FIGS. 1 and 6A-6D, at operation 114, the isolation structure 204 is further recessed such that a top surface of the isolation structure 204 in the channel regions is below a top surface of the substrate 202 (i.e. the top surfaces of the top substrate portions 202N-T and 202P-T, or the bottom surfaces of the lowermost semiconductor layer 210B) for a depth D3 (in the Z-direction). In some embodiments, the isolation structure 204 may be further recessed by an etching process (such as dry etching, wet etching, or combinations thereof), or other proper recessing process. In some embodiments, the depth D3 is at least half of the channel width W1 of the stack 210P. For example, the channel width W1 is about 4 nm to about 10 nm, the depth D3 is at least about 5 nm. Therefore, the BPTs over the top substrate portions 202N-T and 202P-T will have sufficient gate sidewall control to mitigate the voltage mismatch issue and the standby leakage issue. Referring to FIGS. 6A, 6C and 6D, in the depicted embodiment, the top surface of the isolation structure 204 in the source regions or drain regions (both referred to as source/drain (S/D) regions) is substantially coplanar with the top surface of the substrate 202 which is above the top surface of the isolation structure 204 in the channel regions.

In some other embodiments, the isolation structure 204 is further recessed before forming the dummy gate structure 220. That is, the operation 114 can be performed before operation 106. In this case, the isolation structure 204 in both channel regions and S/D regions are recessed such that a top surface of the isolation structure 204 in both channel regions and S/D regions is below a top surface of the substrate 202 for a depth D3.

Now referring to FIGS. 1 and 7A-7D, at operation 116, the semiconductor layers 210B are selectively removed from the gate trenches 236. Due to the different materials of the semiconductor layers 210A and 210B, the semiconductor layers 210B are removed by a selective oxidation/etching process similar as those to remove the edge portions of the semiconductor layers 210B. In some embodiments, the semiconductor layers 210A are slightly etched or not etched during selective removal of the semiconductor layers 210B. Thereby, the semiconductor layers 210A are suspended in the channel regions of the stacks 210 and stacked up along the direction (i.e. the Z-direction) substantially perpendicular to a top surface of the substrate 202 (i.e. the X-Y plane). The suspended semiconductor layers 210A are also referred to as channel semiconductor layers 210A.

Figure 7A:
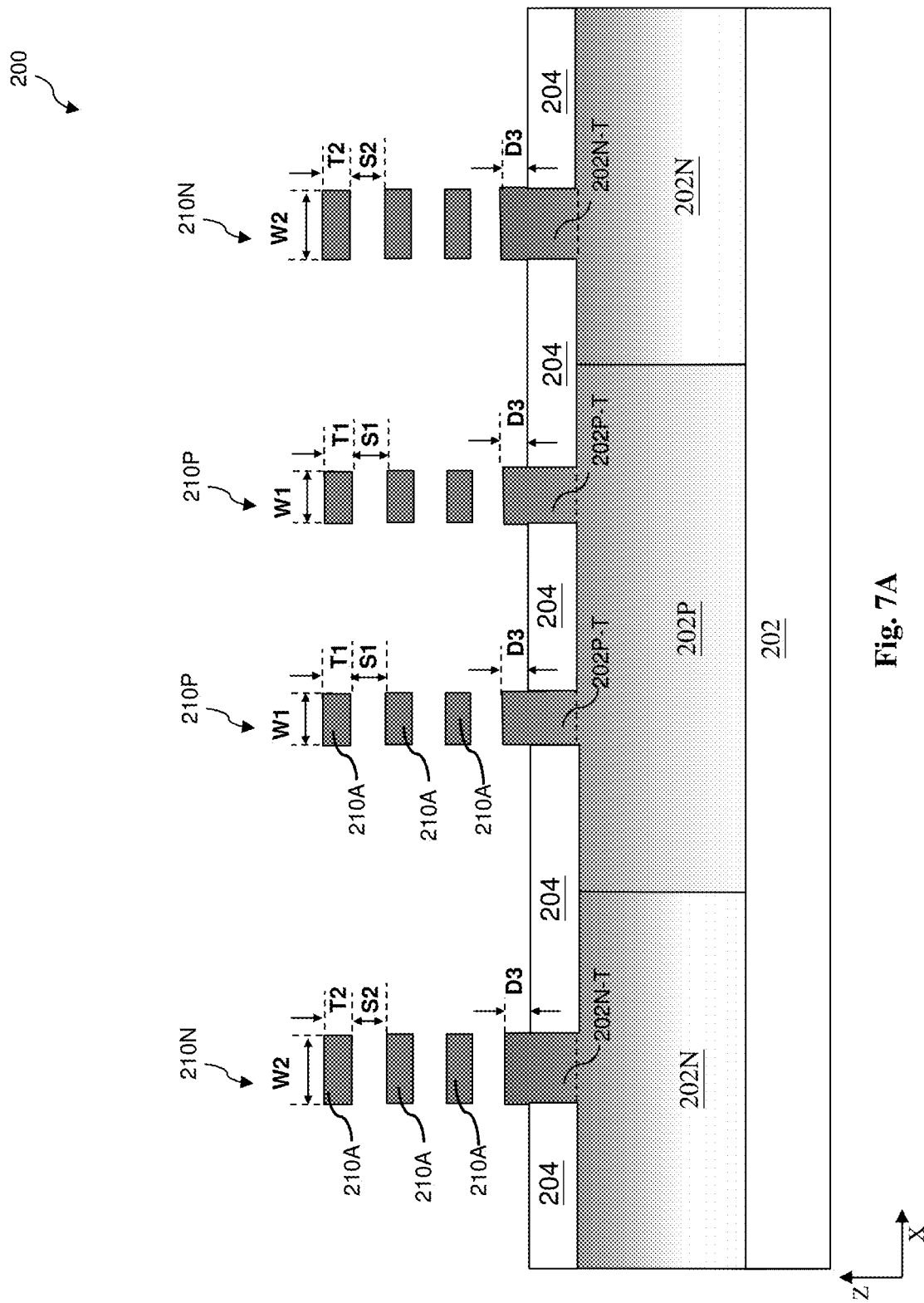
Figure 7C:
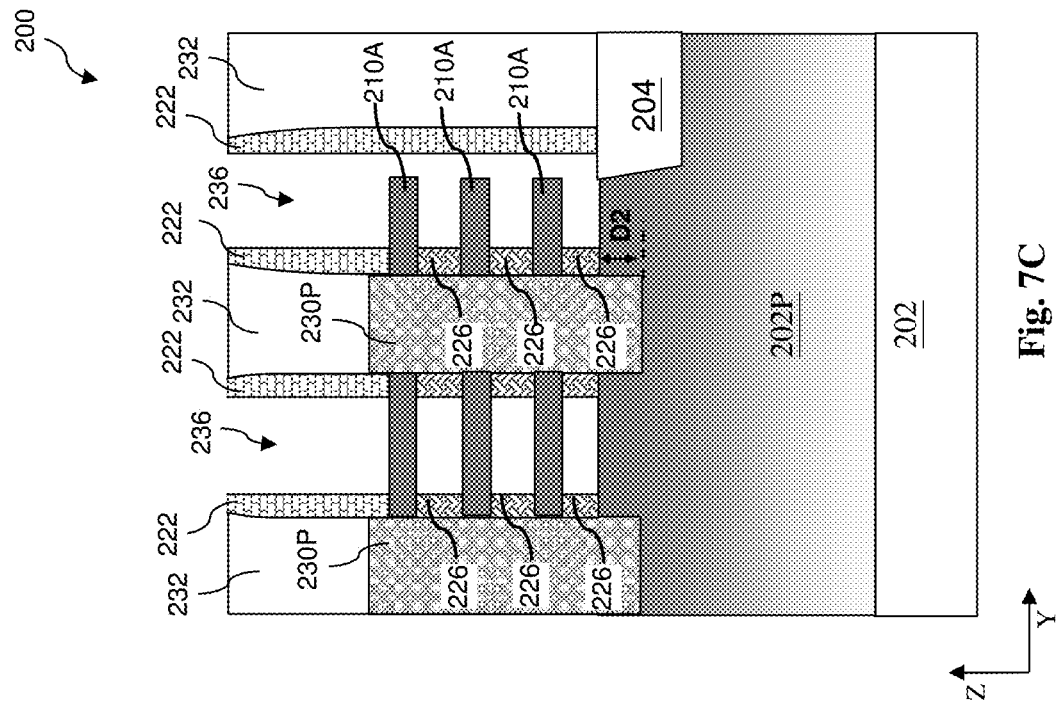
Figure 7B:
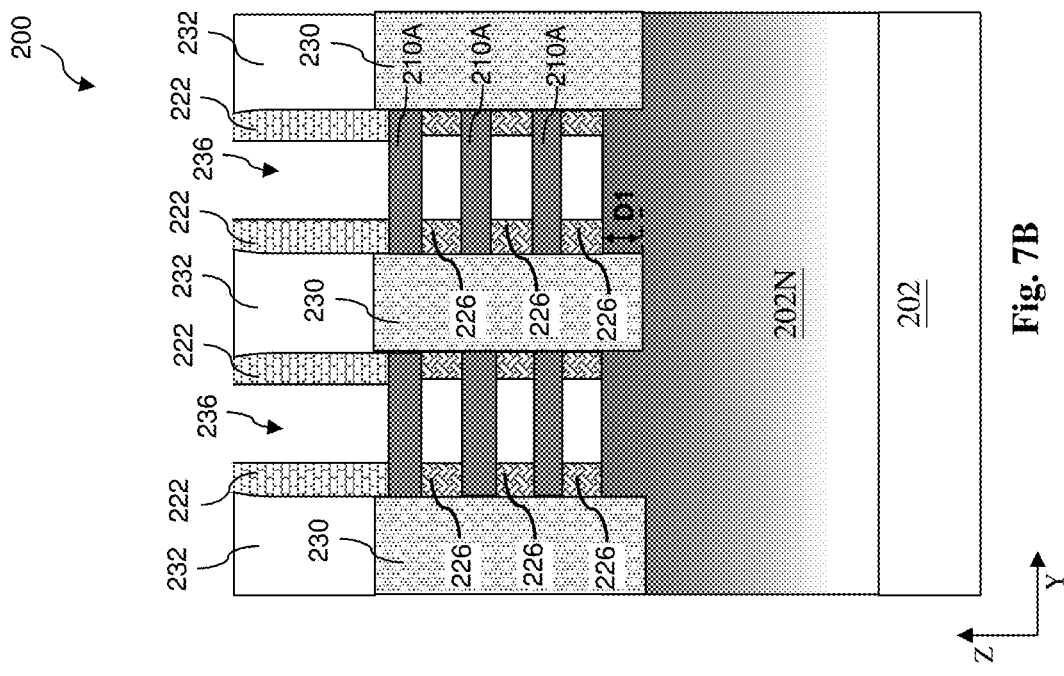
Figure 7D:
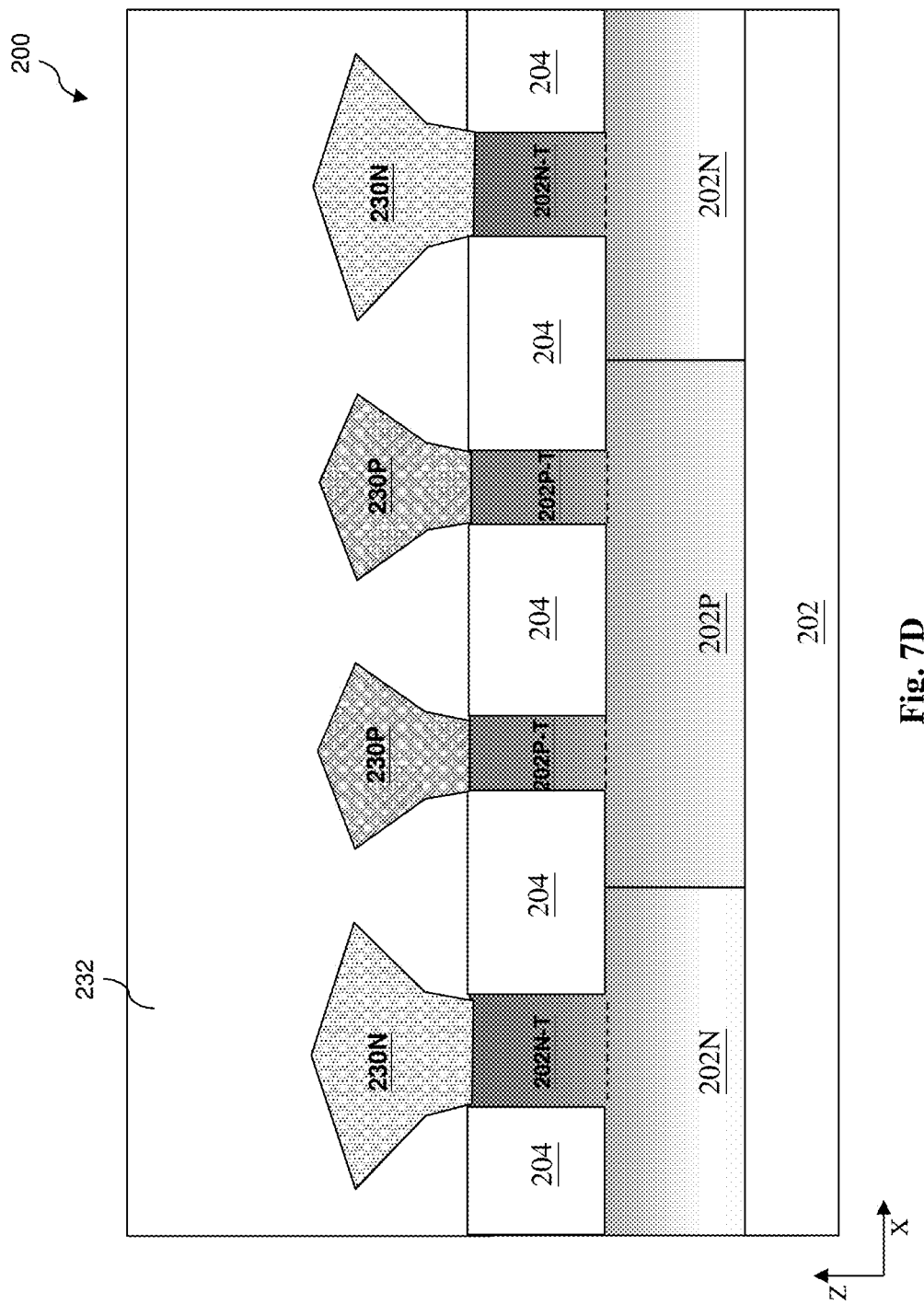

Referring to FIG. 7A, the stack 210P includes the channel semiconductor layers 210A and the top substrate portion 202P-T, and the stack 210N includes the channel semiconductor layers 210A and the top substrate portion 202N-T. The channel semiconductor layers 210A of the P-type stacks 210P has a width W1 in the X-direction (i.e. the channel width W1) and a thickness T1 in the Y-direction (i.e. the channel thickness T1). The distance in the Z-direction between adjacent semiconductor layers 210A of the stacks 210P is Si (i.e. the vertical sheet pitch Si). The channel semiconductor layers 210A of the N-type stacks 210N has a width W2 in the X-direction (i.e. the channel width W2) and a thickness T2 in the Z-direction (i.e. the channel thickness T2). The distance in the Z-direction between adjacent semiconductor layers 210A of the stacks 210N is S2 (i.e. the vertical sheet pitch S2). In some embodiments, the channel width W1 is about 4 nm to about 10 nm, the channel width W2 is about 6 nm to about 20 nm, the channel thickness T1 or T2 is about 4 nm to about 8 nm, the vertical sheet pitch S1 or S2 is about 6 nm to about 15 nm. The top surfaces of both the top substrate portions 202P-T and 202N-T are above the top surface of the isolation structure 204 for a depth D3, which is at least half of the channel width W1 of the P-type transistors. Therefore, the later formed metal gate structures 240 (in FIGS. 8A-8D) can have better sidewall control to mitigate the voltage mismatch and standby leakage issue. In some embodiments, the depth D3 is at least about 5 nm.

Then, referring to FIGS. 1 and 8A-8D, still at operation 116, metal gate structures 240N and 240P (both referred to as metal gate structures 240) are formed in the channel regions of the stacks 210. The metal gate structures 240 wrap each of the suspended channel semiconductor layers 210A. In some embodiments, each metal gate structure 240 includes a gate dielectric layer 242, a metal gate electrode 244, and/or other metal gate layers. In some embodiments, the gate dielectric layer 242 includes an oxide with nitrogen doped dielectric material combined with metal content high-K dielectric material (K>13). In some embodiments, the material of the gate dielectric layer 242 is selected from tantalum oxide (Ta2O5), aluminum oxide (Al2O3), hafnium (Hf) content oxide, tantalum (Ta) content oxide, titanium (Ti) content oxide, zirconium (Zr) content oxide, aluminum (Al) content oxide, lanthanum (La) content oxide, high K material (K>=9), other suitable high-k dielectric material, or combinations thereof. In some embodiments, the gate dielectric layer 242 has a thickness of about 0.5 nm to about 3 nm and is deposited by CVD, PVD, ALD, and/or other suitable method. The metal gate electrode 244 is then filled in the spaces between the gate dielectric layer 242. Each metal gate electrode 244 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the P-type WFM layer material includes TiN, TaN, TaSN, Ru, Mo, Al, WN, WCN, $ZrSi_2$, $MoSi_2$, $TaSi_2$, $NiSi_2$, other P-type work function material, or combinations thereof; the N-type WFM layer material includes Ti, Al, Ag, Mn, Zr, TiAl, TiAlC, TiAlSiC, TaC, TaCN, Tasilicon nitride, TaAl, TaAlC, TaSiAlC, TiAlN, other N-type work function material, or combinations thereof. The bulk metal may include Al, W, Cu, or combinations thereof. The various layers of the metal gate electrode 244 may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the SRAM cell 200.

Figure 8A:
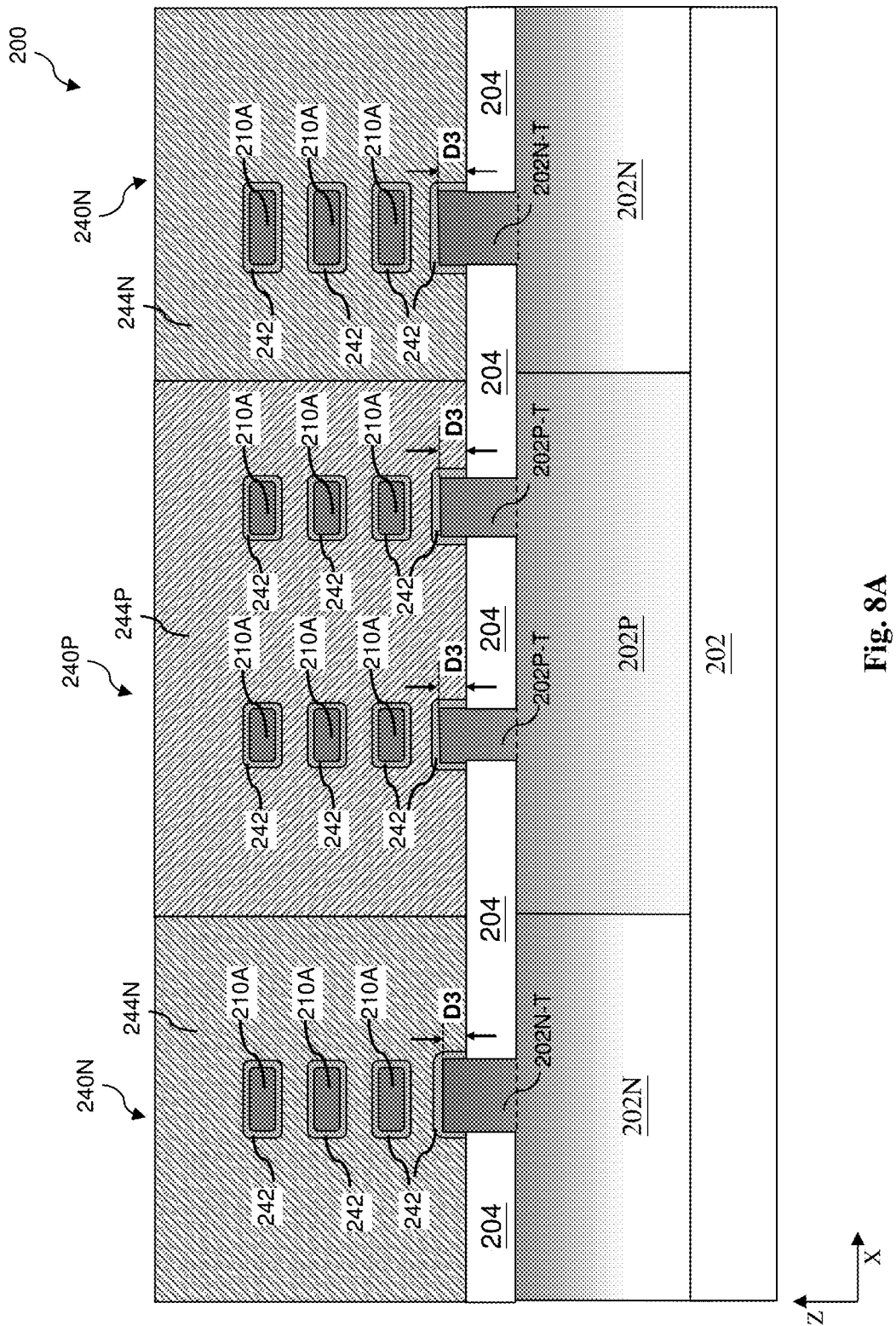
Figure 8D:
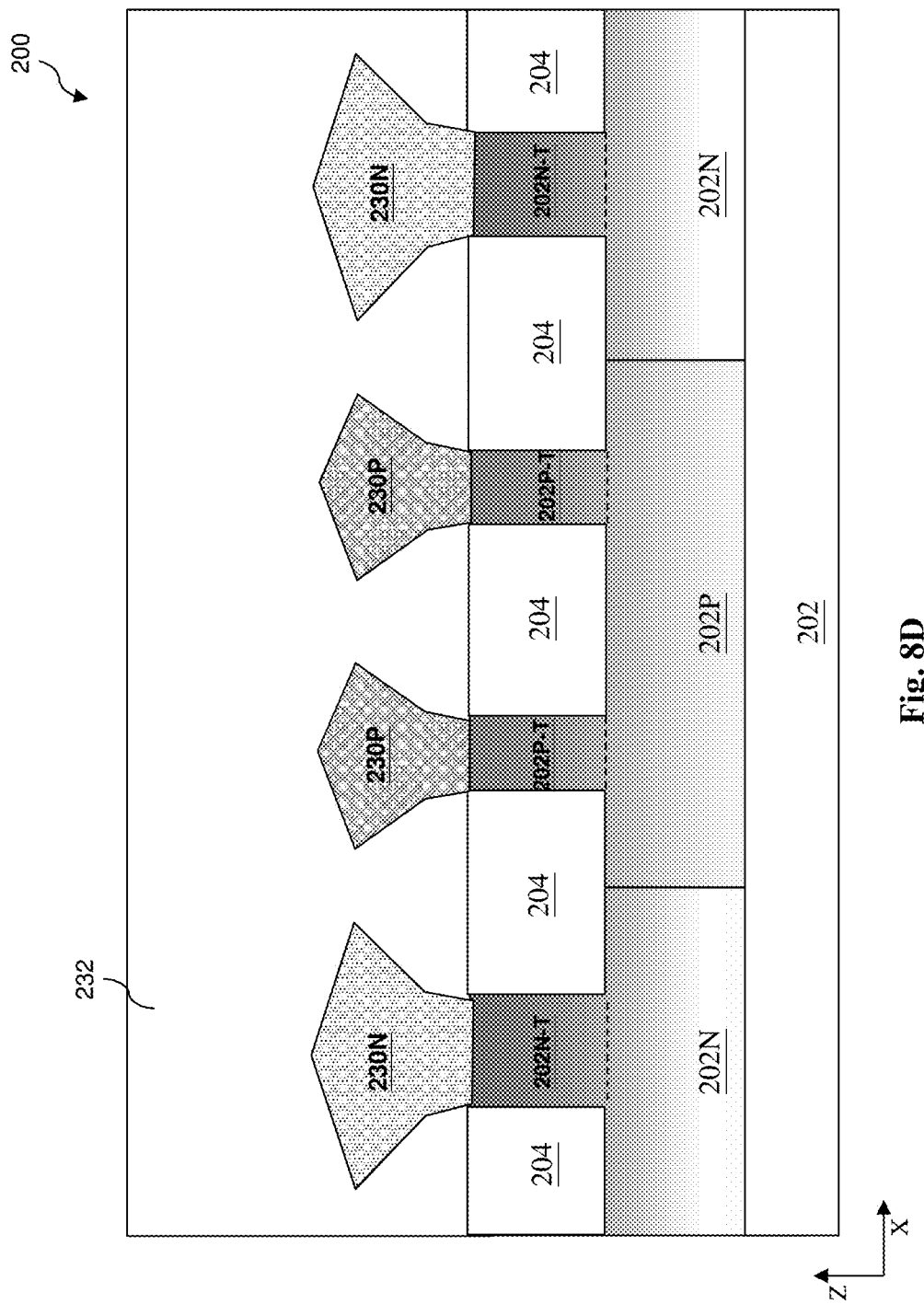
Figure 9A:
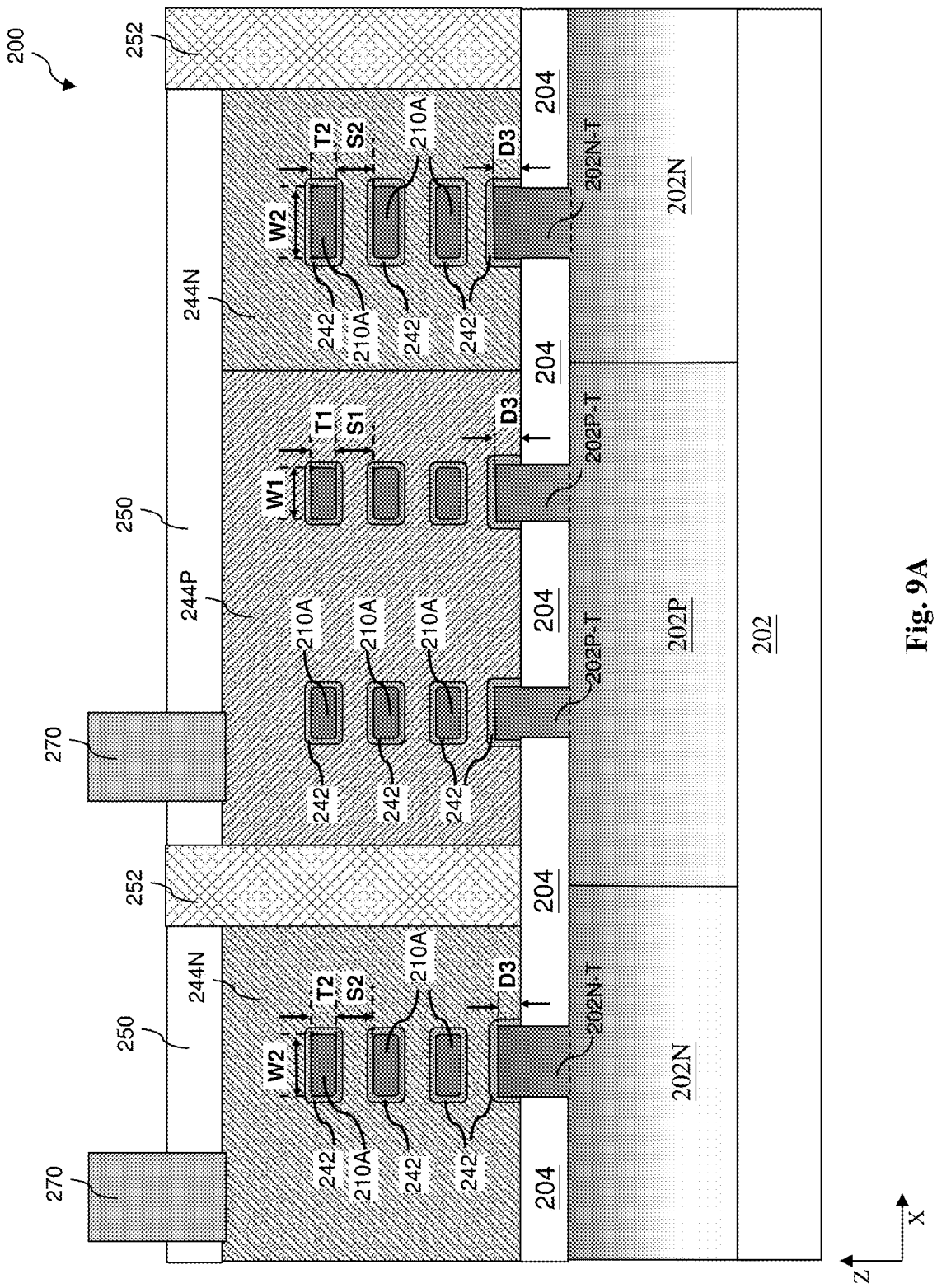
Figure 9C:
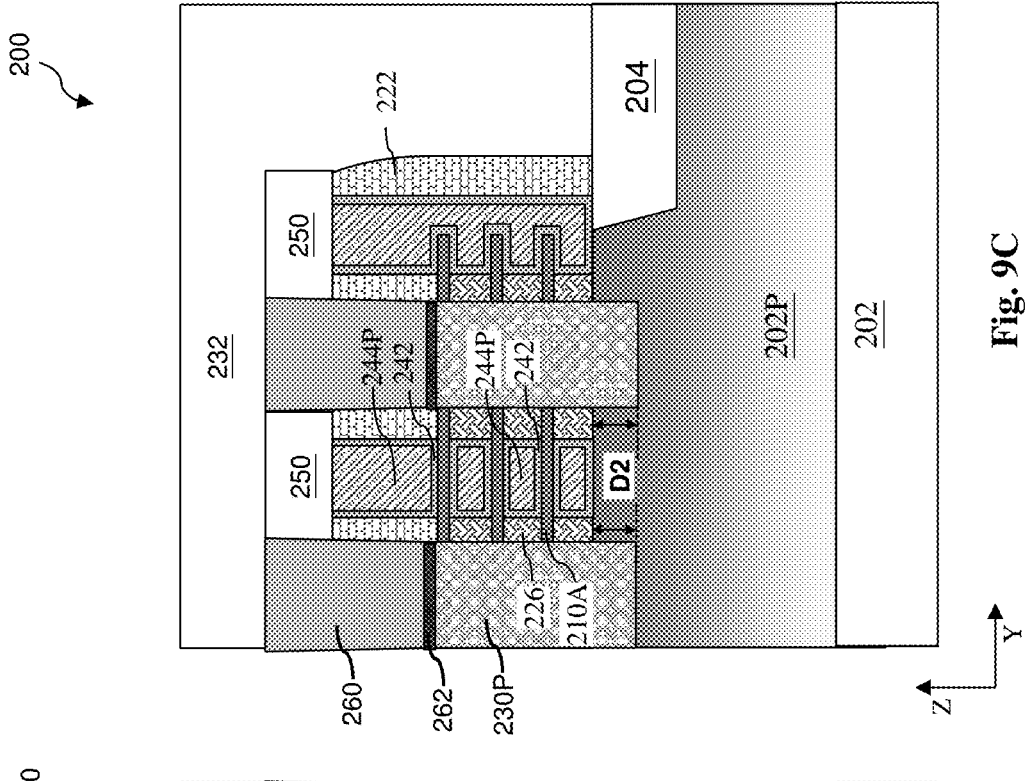
Figure 9B:
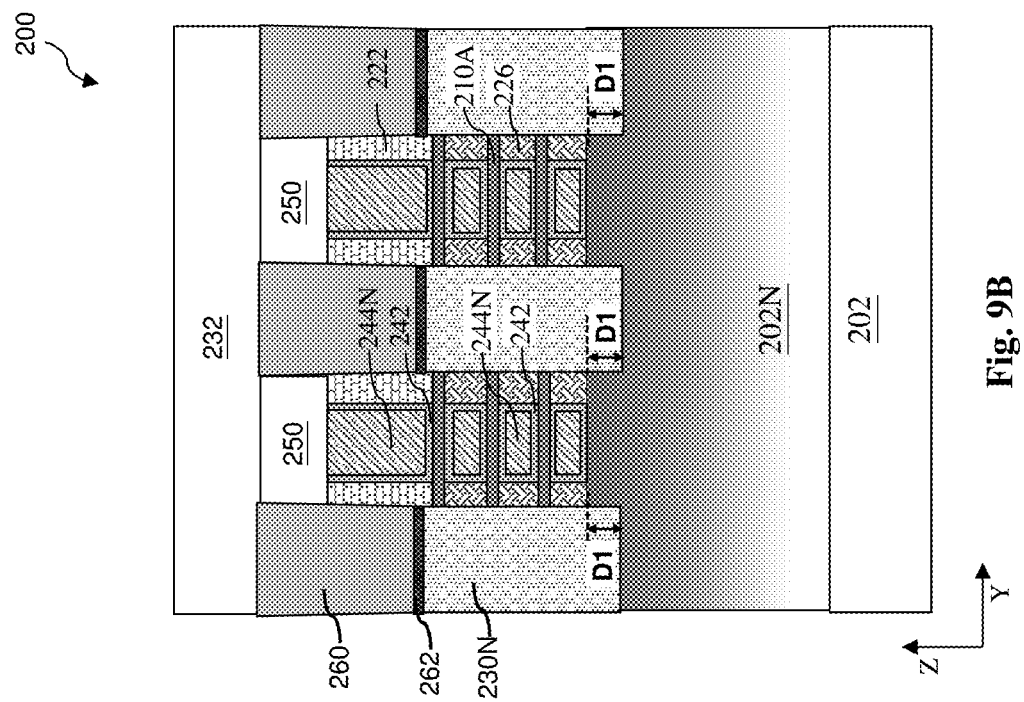
Figure 9D:
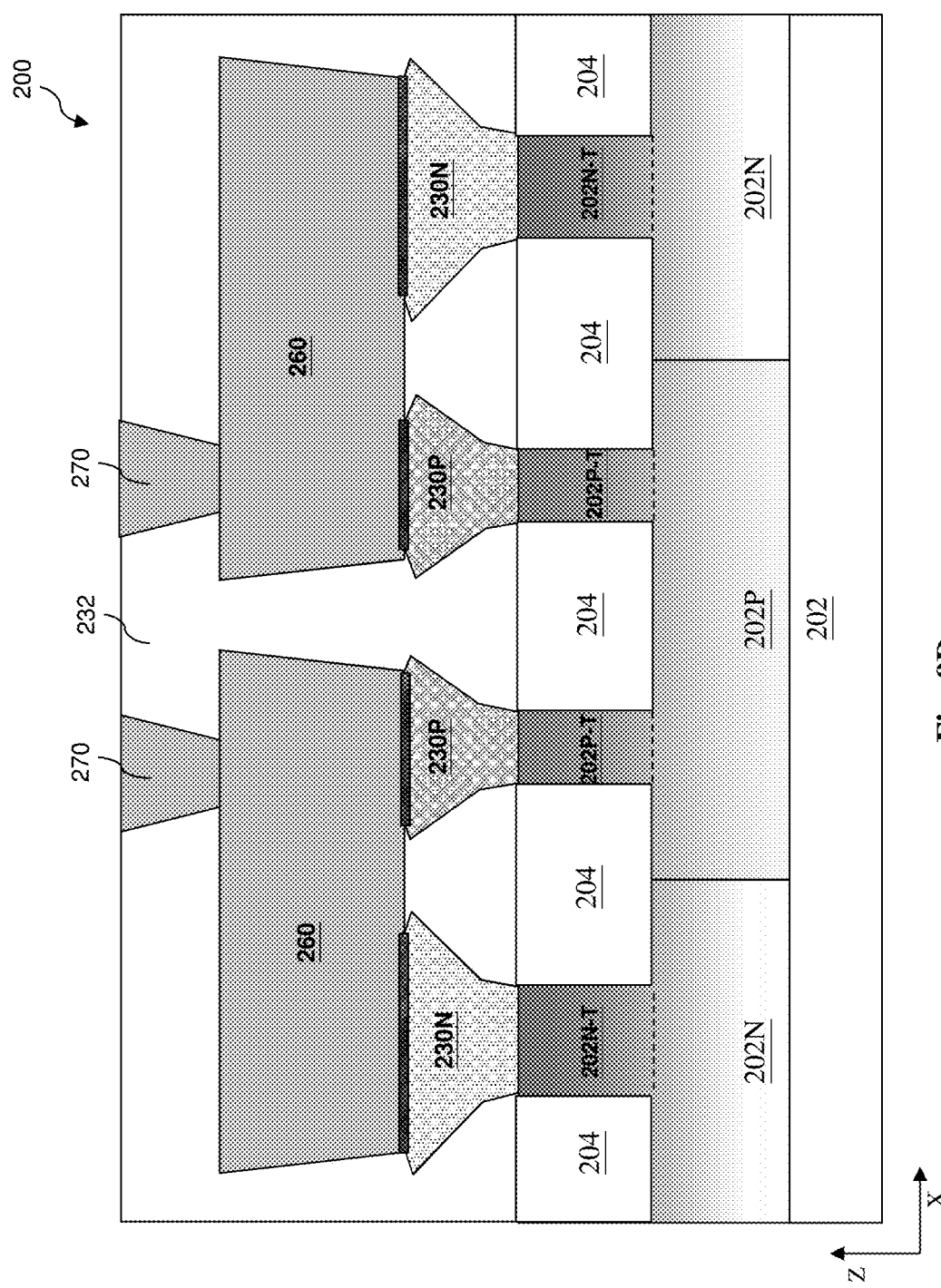

Referring to FIG. 8A, the bottom portion of the metal gate structure 240 (including the gate dielectric layer 242 and the metal gate electrode 244) covers the top surfaces and portions of the sidewalls of the top substrate portions 202N-T and 202P-T, and thereby form tri-gate BPTs. Since the portions of sidewalls covered by the bottom portion of the metal gate structure 240 has a sufficient depth D3 in the Z-direction (D3 is at least half of the channel width W1 of the P-type transistor), the tri-gate BPTs can provide better gate control to mitigate the voltage mismatch issues and reduce the standby leakage. In some embodiments, the depth D3 is at least about 5 nm.

Now, referring to FIGS. 1 and 9A-9D, at operation 118, various other structures are formed to finalize the SRAM cell 200. For example, gate hard mask layers 250 are formed over the top of the gate structures 240 and the gate spacers 222. The gate hard mask layers 250 can serve as contact etch protection layers. In some embodiments, the gate hard mask layers 250 has a thickness of about 2 nm to about 60 nm and include dielectric materials such as oxide based dielectric, nitride based dielectric (e.g. silicon oxycarbide, silicon oxynitride, silicon oxy-carbonitride), metal oxide dielectric (e.g. hafnium oxide (HfO2), tantalum oxide (Ta2O5), titanium oxide (TiO2), zirconium oxide (ZrO2), aluminum oxide (Al2O3), yttrium oxide (Y2O3)), or a combinations thereof. Formation of the gate hard mask layers 250 may include various steps. For example, metal gate etching back, hard mask layer deposition, planarization process, and etc.

In the depicted embodiment, gate end dielectric features 252 are formed to separate the metal gate structures 240 according to the design of the SRAM cell 200. The gate end dielectric features 252 include dielectric materials and can be formed by various steps including lithography, etching, deposition, etc.

S/D contacts 260 are formed over the epitaxial S/D features 230. The S/D contacts 260 includes conductive materials such as Al, W, Cu, or combinations thereof. A silicide layer 262 (for example include nickel silicide, cobalt silicide, tungsten silicide, tantalum silicide, titanium silicide, platinum silicide, erbium silicide, palladium silicide, or combinations thereof) may be formed between the epitaxial S/D features 230 and the S/D contacts 260. Formation of the S/D contacts 260 and the silicide layers 262 may involves multiple lithography, etching, deposition, annealing, and planarization processes. In some embodiments, the S/D contacts 260 are formed by a self-aligned contact forming process.

Various other interconnection structures are then formed over the top of the SRAM cell 200. In some embodiments, the various interconnection structures may include multiple dielectric ILD layers, contacts 270, vias 280, metal lines, and/or other structures, configured to connect the various features to form a functional SRAM cell.

In some embodiments, an integrated circuit (IC) including the SRAM cell 200 may also include other SRAM cells. In some embodiments, a second SRAM cell included in the same IC has a larger channel width than the SRAM cell 200. For example, the channel width of the PU transistors (i.e. the P-type transistors) of the second SRAM is about 6 nm to about 20 nm, and the channel width of the PG/PD transistors (i.e. the N-type transistors) of the second SRAM is about 10 nm to about 40 nm. Accordingly, the cell size of the second SRAM cell is about 1.1 to about 1.4 times of the SRAM cell 200.

Figure 10:
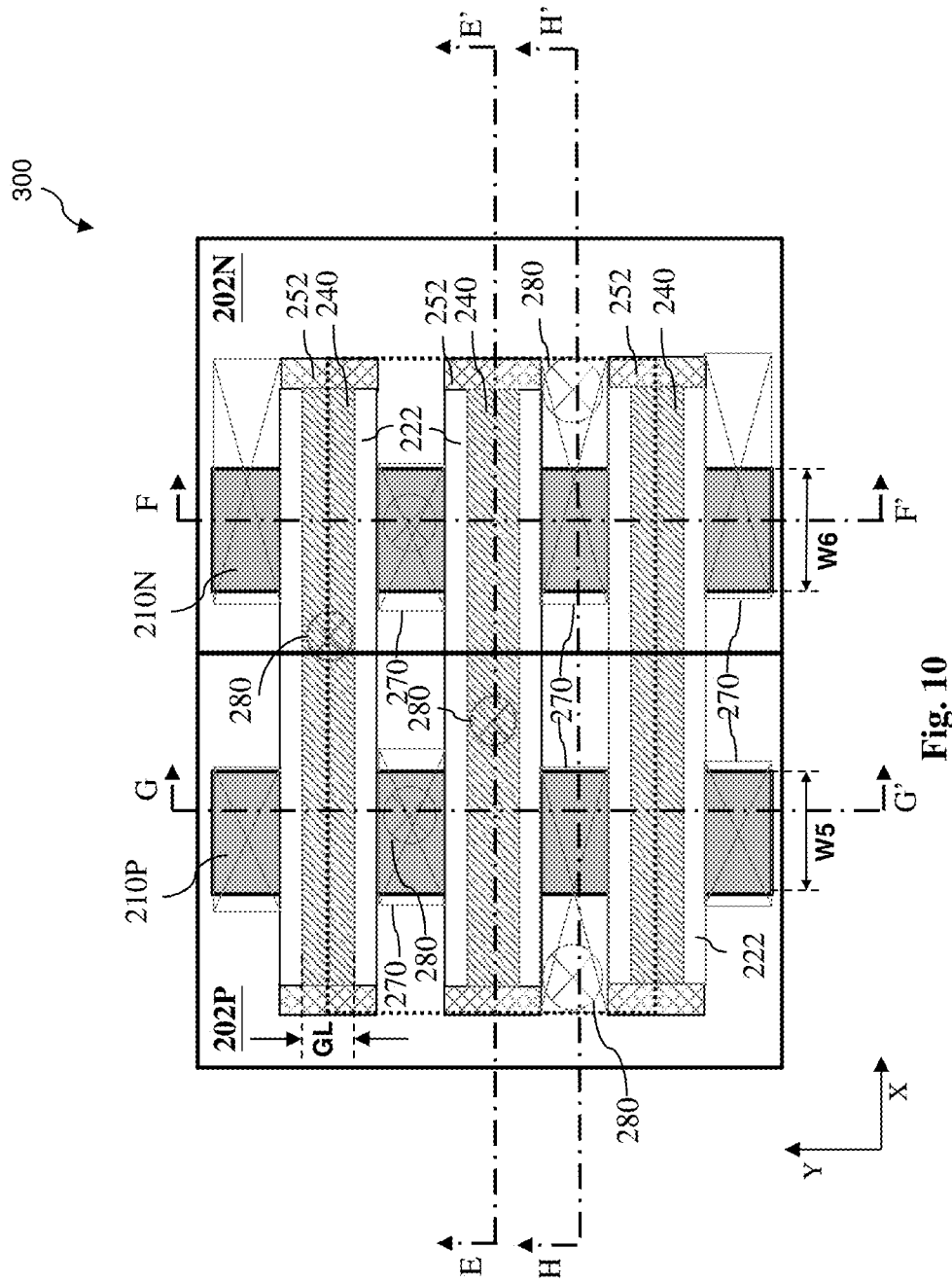
FIG. 10 illustrates a top view of an example logic cell in accordance with another embodiment of the present disclosure.

FIG. 10 illustrates a top view of a logic cell 300 in accordance with another embodiment of the present disclosure. FIGS. 11A-11D illustrate cross-sectional views of the logic cell 300 along lines E-E', F-F', G-G', H-H' in FIG. 10, respectively. The same reference numbers in the logic cell 300 represent the same semiconductor structures/elements in the SRAM cell 200, which has the same size and same fabrication process unless indicated in the following description.

Figure 11A:
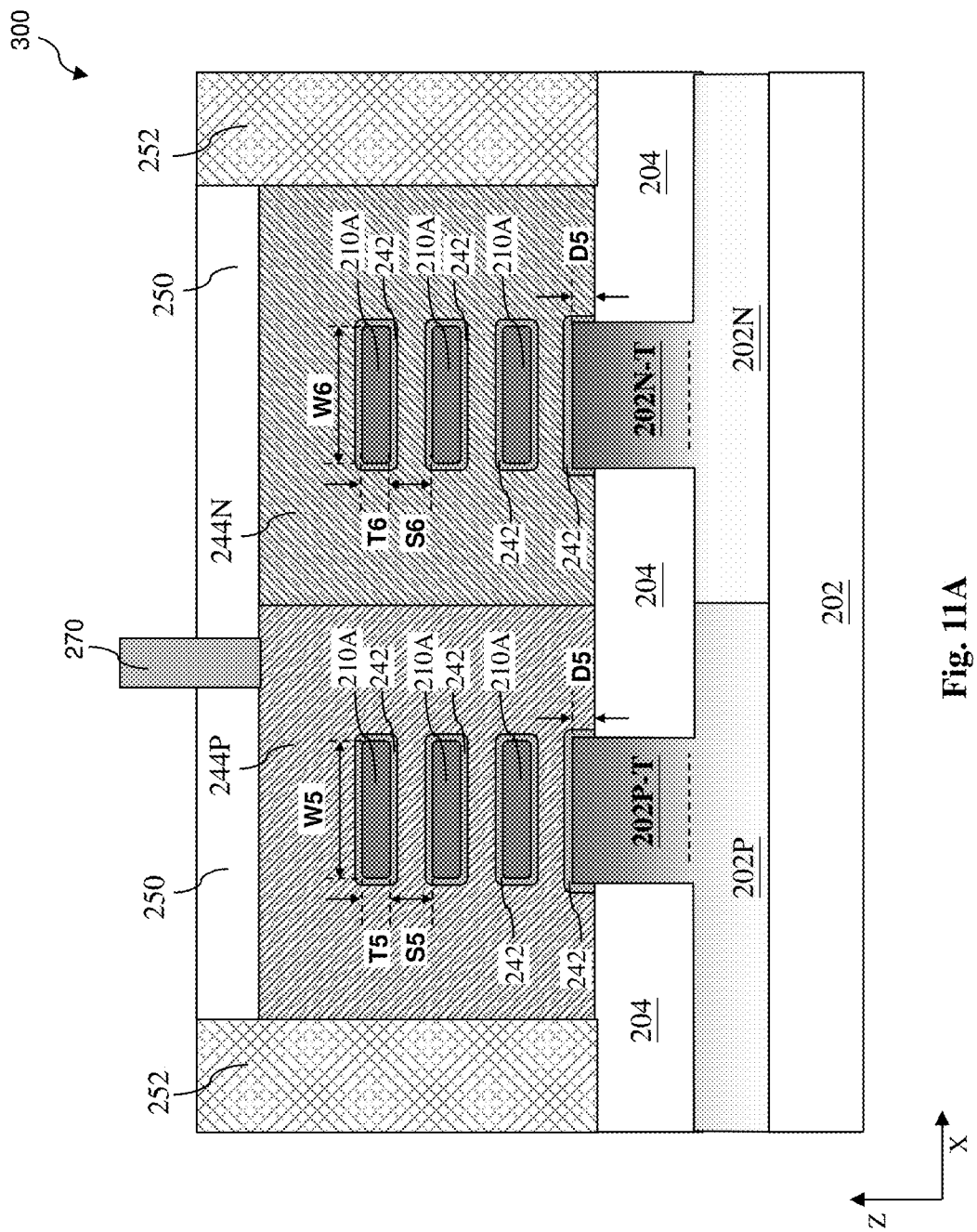
FIGS. 11A, 11B, 11C, and 11D illustrate cross-sectional views of the example logic cell along lines E-E', F-F', G-G', H-H' in FIG. 10, respectively, in accordance with some embodiments of the present disclosure.

As illustrated in FIG. 11A, the stack 210P includes channel semiconductor layers 210A and a top substrate portion 202P-T. The channel width for the stack 210P is W5. The channel thickness of the stack 210P is T5, and the vertical sheet pitch of the stack 210P is S5. The stack 210N includes channel semiconductor layers 210A and a top substrate portion 202N-T. The channel width for the stack 210N is W6. The channel thickness of the stack 210N is T6, and the vertical sheet pitch of the stack 210N is S6. In some embodiments, the channel width W5 or W6 is about 30 nm to about 40 nm. The channel thickness T5 or T6 is about 4 nm to about 8 nm. The vertical sheet pitch S5 or S6 is about 6 nm to about 15 nm. In the depicted embodiment, the bottom portions of the metal gate structures, including the gate dielectric layers 242 and the metal gate electrodes 244 (i.e. 244P and 244N), cover the top surfaces and portions of the sidewalls of the top substrate portions 202N-T and 202P-T, and thereby form tri-gate BPTs. Since the portions of sidewalls covered by the bottom portions of the metal gate structures 240 have a sufficient depth D5 in the Y-direction, the tri-gate BPTs can provide better gate control to mitigate the voltage mismatch issues and reduce the standby leakage. In some embodiments, the distance D5 is at least about 5 nm.

Figure 11B:
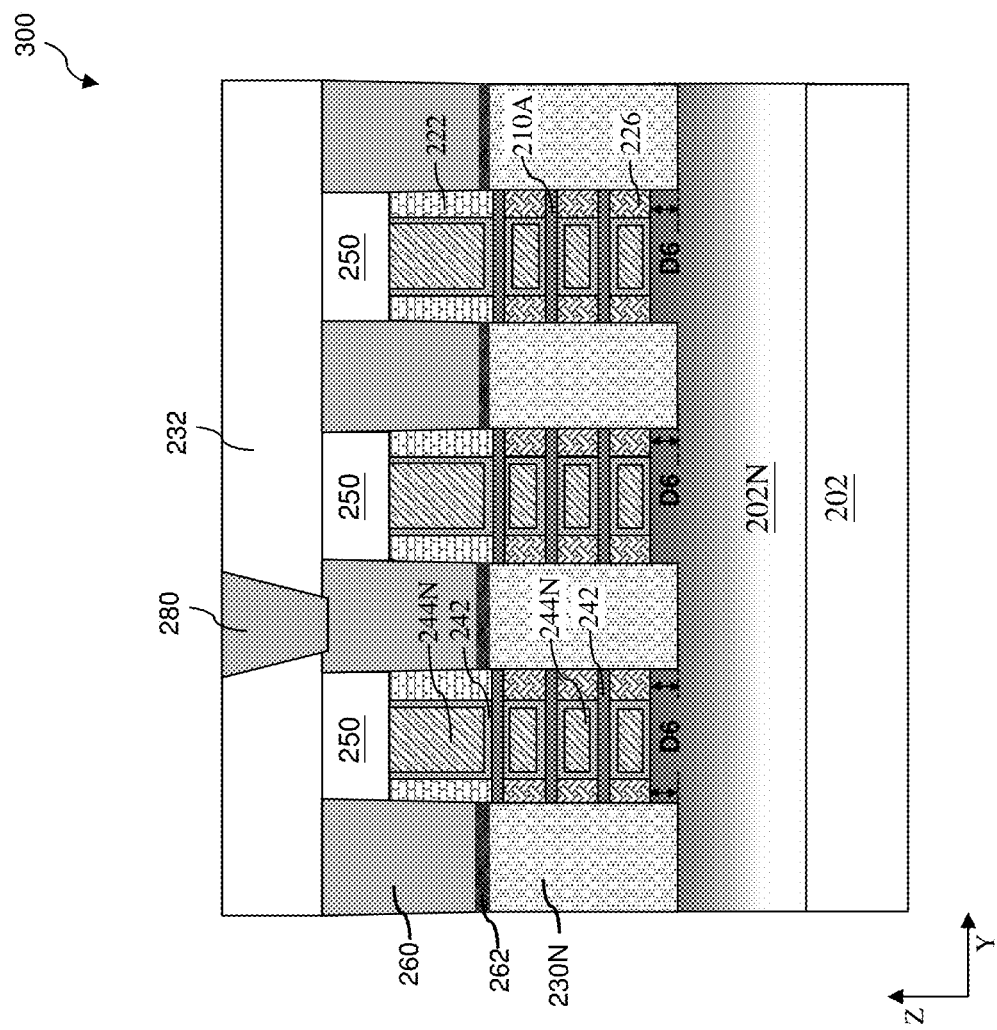
Figure 11C:
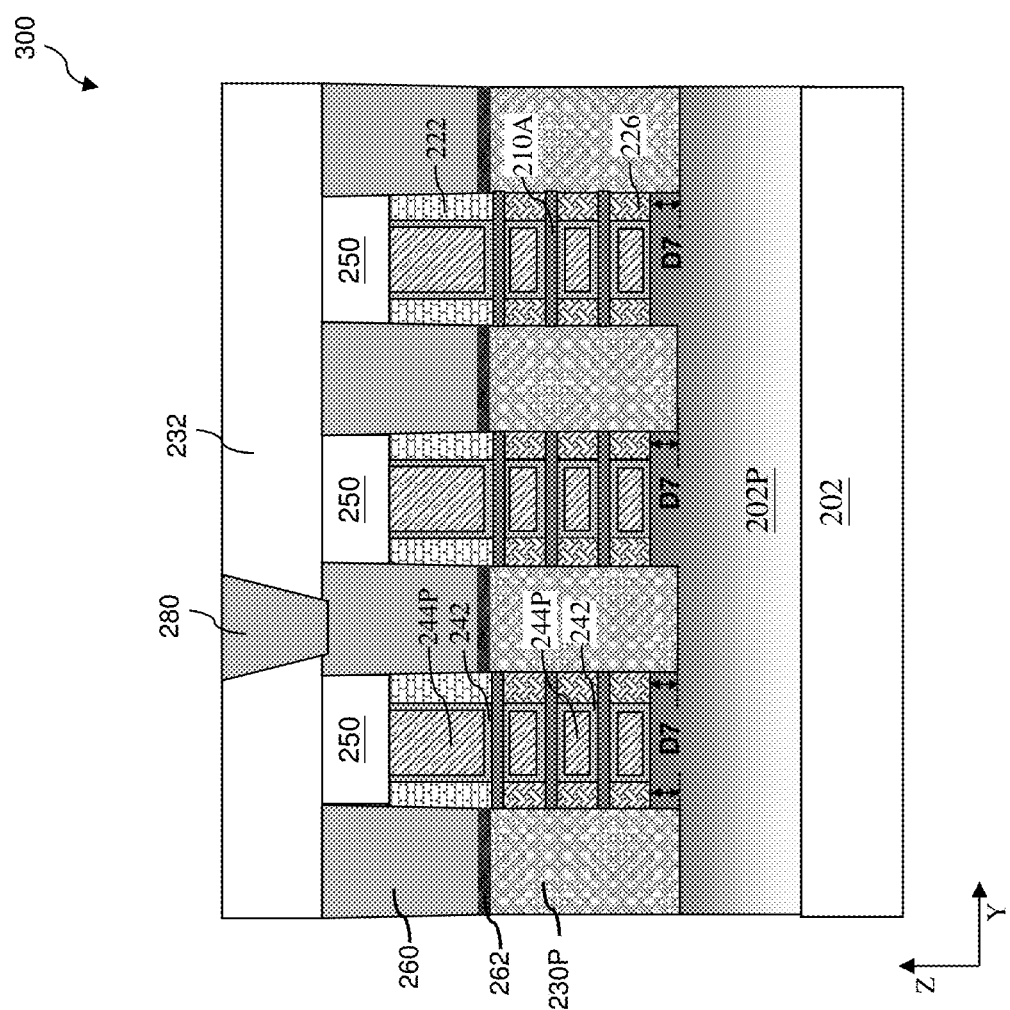
Figure 11D:
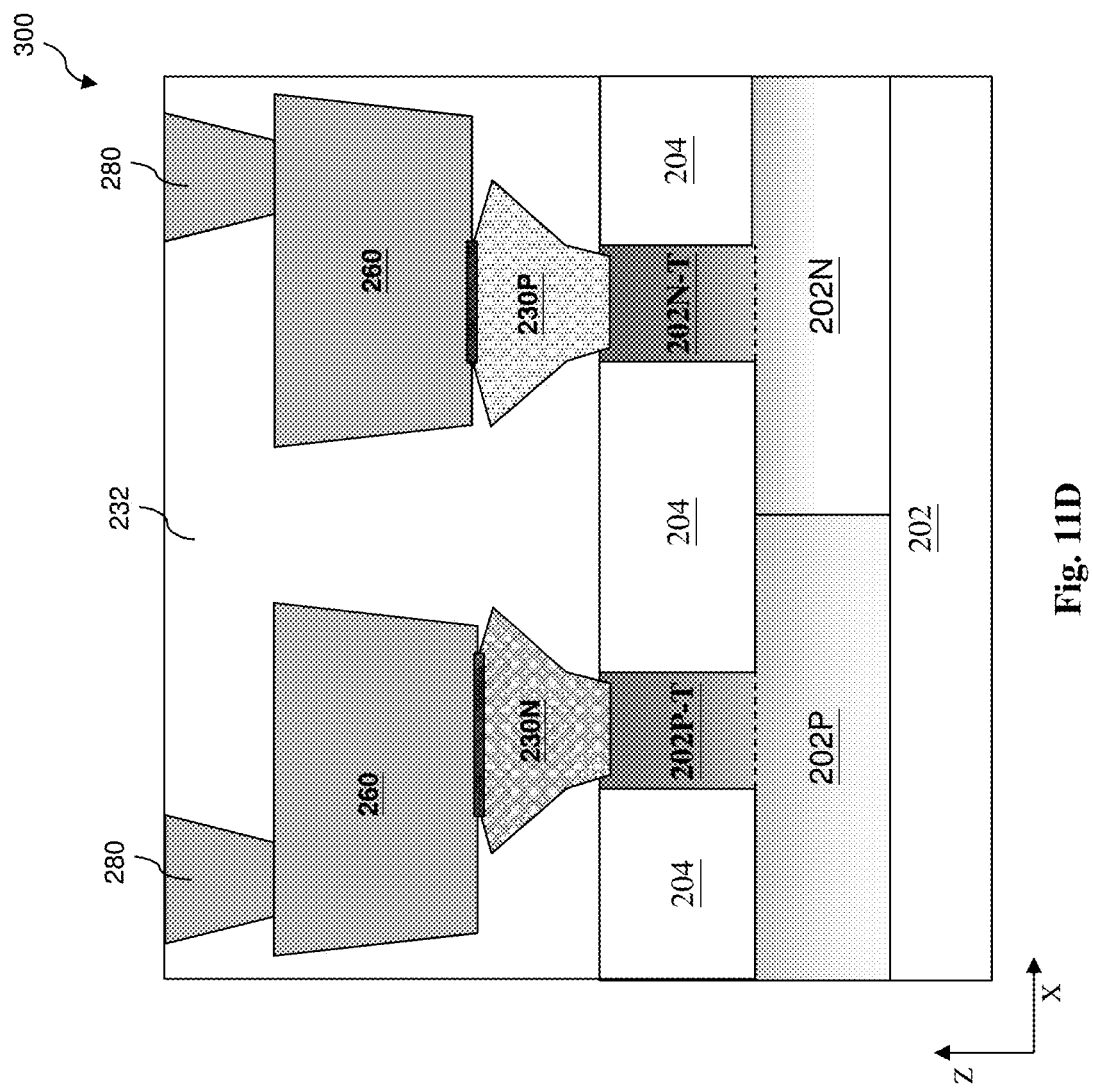

Referring to FIG. 11B, the S/D features 230N extend into the N-type substrate portion 202N for a depth D6. In other words, the bottom surfaces of the S/D features 230N are below the top surface of the substrate for a depth D6. Referring to FIG. 11C, the S/D features 230P extend into the P-type substrate portion 202P for a depth D7. In other words, the bottom surfaces of the S/D features 230P are below the top surface of the substrate for a depth D7. In some embodiments, the depth D6 is about 5 nm to about 40 nm and the depth D7 is about 5 nm to about 50 nm. The depth D7 is greater than the depth D6 for about 5 nm to about 30 nm, such that the P-type S/D feature 230P (e.g. including Si:Ge:B) can provide more strain to the P-type nanostructure transistors for Ion improvement.

Although not intended to be limiting, one or more embodiments of the present disclosure provide many benefits to an integrated circuit and a formation process thereof. For example, embodiments of the present disclosure provide a semiconductor device including recessed gate structures extending in the substrate. The extent that the bottom surface of the recessed gate structures below the top surface of the substrate is at least half of the channel width of the FET to form tri-gate BPTs. The tri-gate BPTs has better sidewall gate control than a conventional BPT of the nanostructure transistor, which can mitigate the voltage mismatch and the standby leakage issues. The extra sidewall gate control also allows lower APT dosage for junction leakage reduction, and thus can mitigate the APT dopant out-diffusion impact. In addition, in the present disclosure, the P-type epitaxial S/D features extend more in the substrate than the N-type epitaxial S/D features. The larger size of the P-type epitaxial S/D feature can provide more strain to the P-type FET which is benefit for Ion improvement. Accordingly, the performance and the reliability of the semiconductor device is improved.

The present disclosure provides for many different embodiments. In one aspect, a semiconductor device is provided. The semiconductor device includes a substrate including top portions isolated by an isolation structure, first semiconductor layers over a first top portion of the substrate in a first region, and a first gate structure wrapping each of the first semiconductor layers and covering a top surface and sidewalls of the first top portion of the substrate extending above the isolation structure. The first semiconductor layers are stacked up and separated from each other, and each first semiconductor layer has a first width. A bottom surface of the first gate structure is below the top surface of the substrate for a first depth which is at least half of the first width.

In some embodiments, the first depth is at least about 5 nm, and the first width of the first semiconductor layer is less than or equal to about 10 nm. In some implementations, the semiconductor device may further include a first source/drain (S/D) feature formed in the first region of the substrate. A bottom surface of the first S/D feature is below the top surface of the substrate for a second depth. In some instances, the second depth is at least about 5 nm. In some embodiments, the semiconductor device may further include a second S/D feature formed in a second region of the substrate. A bottom surface of the second S/D feature is below the top surface of the substrate for a third depth greater than the second depth. In some embodiments, the semiconductor device may further include second semiconductor layers over a second top portion of the substrate in the second region. The second semiconductor layers are stacked up and separated from each other, and each second semiconductor layer has a second width greater than the first width of the first semiconductor layer. The semiconductor device may further include a second gate structure wrapping each of the second semiconductor layers and covers the top surface and the sidewalls of the second top portion of the substrate extending above the isolation structure. A bottom surface of the second gate structure is below the top surface of the substrate for the first depth.

In another aspect, an integrated circuit is provided. The integrated circuit includes a substrate including a P-type region and an N-type region, wherein the substrate includes top portions separated by an isolation structure, a first semiconductor stack over the P-type region of the substrate and a second semiconductor stack over the N-type region of the substrate, wherein each of the first semiconductor stack and the second semiconductor stack includes semiconductor layers stacked up and separated from each other, and a first source/drain (S/D) feature formed over the P-type region of the substrate and a second S/D feature formed over the N-type region of the substrate, wherein a bottom surface of the first S/D feature is below a top surface of the substrate for a first depth and a bottom surface of the second S/D feature is below the top surface of the substrate for a second depth which is less than the first depth.

In some embodiments, the first depth is about 5 nm to about 50 nm. In some implementations, the second depth is about 5 nm to about 40 nm. In some instances, the integrated circuit may further include a first gate structure formed over the P-type region and a second gate structure formed over the N-type region of the substrate, wherein bottom surfaces of the first gate structure and the second gate structure are below the top surface of the substrate for a third depth. In some instances, the third depth is at least about 5 nm. In some embodiments, the top portions of the substrate include anti-punch-through (APT) dopant.

In still another aspect, a method for forming an integrated circuit is provided. The method may include receiving a substrate including a first region and a second region, alternately growing first semiconductor layers and second semiconductor layers over the substrate, wherein the first semiconductor layers and the second semiconductor layers include different semiconductor materials, etching the first semiconductor layers, the second semiconductor layers, and portions of the substrate to form a first semiconductor stack having a first width in the first region and a second semiconductor stack having a second width in the second region, wherein the second width is greater than the first width, each of the first semiconductor stack and the second semiconductor stack includes the first semiconductor layers, the second semiconductor layers, and a top portion of the substrate, forming an isolation structure between the top portions of the substrate, recessing the isolation structure such that a top surface of the isolation structure in a channel region is below a top surface of the substrate for a first depth, which is at least half of the first width of the first semiconductor stack, and forming a first gate structure wrapping each of the first semiconductor layers of the first semiconductor stack and a second gate structure wrapping each of the first semiconductor layers of the second semiconductor stack, wherein bottom surfaces of the first gate structure and the second gate structure are below the top surface of the substrate for the first depth.

In some embodiments, the method may further include forming a first source/drain (S/D) trench in the first region and a second S/D trench in the second region, wherein bottom surfaces of the first S/D trench and the second S/D trench are below the top surface of the substrate, and epitaxially growing a first S/D feature in the first S/D trench and a second S/D feature in the second S/D trench. In some implementations, the bottom surface of the first S/D trench is below the top surface of the substrate for a second depth, the bottom surface of the second S/D trench is below the top surface of the substrate for a third depth less than the second depth. In some instances, the forming the first gate structure and the second gate structure includes forming a dummy gate structure over the first semiconductor stack and the second semiconductor stack, forming gate spacers along sidewalls of the dummy gate structure, removing the dummy gate structure to form a gate trench, selective removing the second semiconductor layers of the first semiconductor stack and the second semiconductor stack through the gate trench, forming gate dielectric layers wrapping each of the first semiconductor layers and covering an exposed portion of the top portions of the substrate; and depositing a conductive material over the gate dielectric layers.

In some embodiments, the recessing the isolation structure is performed before forming the dummy gate structure. In some embodiments, the recessing the isolation structure is performed after removing the dummy gate structure. In some implementations, the method may further include selectively removing edge portions of the second semiconductor layers after forming the first S/D trench and the second S/D trench, and forming inner spacers in the removed edge portions of the second semiconductor layers, wherein the inner spacer includes different material than the top spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
 receiving a workpiece that includes:
  a substrate having a p-type well and an n-type well,
  a first base fin portion over the p-type well and a second base fin over the n-type well, the first base fin portion and the second base fin portion being disposed in an isolation feature disposed over the substrate, and
  a first semiconductor stack disposed on the first base fin portion and a second semiconductor stack disposed on the second base fin, each of the first semiconductor stack and the second semiconductor stack comprising first semiconductor layers interleaved by second semiconductor layers;
 recessing the isolation feature such that a top surface of the isolation feature is lower than a top surface of the first base fin portion by a depth;
 forming a dummy gate structure over a channel region of the first semiconductor stack, a channel region of the second semiconductor stack, and the recessed isolation feature;
 depositing gate spacers over sidewalls of the dummy gate structure;
 after the depositing of the gate spacers, recessing source/drain regions of the first semiconductor stack and the second semiconductor stack to form source/drain trenches;

forming source/drain features in the source/drain trenches;

after the forming of the source/drain features, removing the dummy gate structure from the channel regions of the first semiconductor stack and the second semiconductor stack;

selectively removing the second semiconductor layers to release the first semiconductor layers as suspended channel layers; and forming a gate structure to wrap around each of the suspended channel layers, wherein the first semiconductor stack comprises a first width and the second semiconductor stack comprises a second width different from the first width.

2. The method of claim 1, wherein a bottom surface of the gate structure is lower than the top surface of the first base fin portion by the depth.

3. The method of claim 1, wherein the gate structure extends lengthwise along a first direction, wherein each of the suspended channel layers has a width, and wherein the depth is at least one half of the width.

4. The method of claim 3, wherein the depth is equal to or greater than 5 nm.

5. The method of claim 1, wherein the first semiconductor layers comprise silicon and the second semiconductor layers comprise silicon germanium.

6. The method of claim 1, further comprising:

before the forming of the source/drain features, selectively recessing the second semiconductor layers to form inner spacer recesses; and forming inner spacer features in the inner spacer recesses.

7. A method, comprising:

receiving a substrate having a p-type well and an n-type well;

forming a first semiconductor stack on a first base fin over the p-type well, the first semiconductor stack having a first width;

forming a second semiconductor stack on a second base fin over the n-type well, the second semiconductor stack having a second width smaller than the first width;

forming an isolation feature between the first base fin and the second base fin;

forming a dummy gate structure over channel regions of the first semiconductor stack and the second semiconductor stack;

selectively recessing a source/drain region of the first semiconductor stack to form a first source/drain trench having a first depth below a top surface of the first base fin;

selectively recessing a source/drain region of the second semiconductor stack to form a second source/drain trench having a second depth below a top surface of the second base fin;

forming an n-type source/drain feature in the first source/drain trench; and forming a p-type source/drain feature in the second source/drain trench, wherein each of the first semiconductor stack and the second semiconductor stack comprises first semiconductor layers interleaved by second semiconductor layers, wherein the second depth is greater than the first depth.

8. The method of claim 7, wherein the second depth is greater than the first depth by between about 5 nm and about 30 nm.

9. The method of claim 7, further comprising:

depositing a dielectric layer over the n-type source/drain feature and the p-type source/drain feature;

removing the dummy gate structure;

selectively removing the second semiconductor layers in the channel regions of the first semiconductor stack and the second semiconductor stack to release the first semiconductor layers as channel layers; and forming a gate structure to wrap around each of the channel layers.

10. The method of claim 9, wherein a bottom surface of the gate structure is lower than the top surface of the first base fin or the top surface of the second base fin by a third depth, wherein the third depth is equal to or greater than one half of the second width.

11. The method of claim 10, wherein the third depth is greater than or equal to 5 nm.

12. The method of claim 9, further comprising:

forming a gate end dielectric feature to separate the gate structure into a first segment over the p-type well and a second segment over the n-type well.

13. The method of claim 12, wherein the p-type well borders the n-type well at an interface, wherein the gate end dielectric feature is aligned with the interface.

14. A method for forming an integrated circuit, comprising:

receiving a substrate including a first region and a second region;

alternately growing first semiconductor layers and second semiconductor layers over the substrate, wherein the first semiconductor layers and the second semiconductor layers include different semiconductor materials;

etching the first semiconductor layers, the second semiconductor layers, and portions of the substrate to form a first semiconductor stack having a first width in the first region and a second semiconductor stack having a second width in the second region, wherein the second width is greater than the first width, each of the first semiconductor stack and the second semiconductor stack includes the first semiconductor layers, the second semiconductor layers, and a top portion of the substrate;

forming an isolation structure between the top portions of the substrate;

recessing the isolation structure such that a top surface of the isolation structure in a channel region is below a top surface of the substrate for a first depth, which is at least half of the first width of the first semiconductor stack; and forming a first gate structure wrapping each of the first semiconductor layers of the first semiconductor stack and a second gate structure wrapping each of the first semiconductor layers of the second semiconductor stack, wherein bottom surfaces of the first gate structure and the second gate structure are below the top surface of the substrate for the first depth.

15. The method of claim 14, further comprising:

forming a first source/drain (S/D) trench in the first region and a second S/D trench in the second region, wherein bottom surfaces of the first S/D trench and the second S/D trench are below the top surface of the substrate; and epitaxially growing a first S/D feature in the first S/D trench and a second S/D feature in the second S/D trench.

16. The method of claim 15, wherein the bottom surface of the first S/D trench is below the top surface of the substrate for a second depth, the bottom surface of the second S/D trench is below the top surface of the substrate for a third depth less than the second depth.

17. The method of claim 15, wherein the forming the first gate structure and the second gate structure includes:

forming a dummy gate structure over the first semiconductor stack and the second semiconductor stack;

forming gate spacers along sidewalls of the dummy gate structure;

removing the dummy gate structure to form a gate trench;

selective removing the second semiconductor layers of the first semiconductor stack and the second semiconductor stack through the gate trench;

forming gate dielectric layers wrapping each of the first semiconductor layers and covering an exposed portion of the top portions of the substrate; and depositing a conductive material over the gate dielectric layers.

18. The method of claim 17, wherein the recessing the isolation structure is performed before forming the dummy gate structure.

19. The method of claim 17, wherein the recessing the isolation structure is performed after removing the dummy gate structure.

20. The method of claim 17, further comprising:

selectively removing edge portions of the second semiconductor layers after forming the first S/D trench and the second S/D trench; and forming inner spacers in the removed edge portions of the second semiconductor layers, wherein the inner spacer includes different material than the gate spacers.

* * * * *